United States Patent
Zhang et al.

(10) Patent No.: US 11,721,286 B2
(45) Date of Patent: Aug. 8, 2023

(54) PIXEL CIRCUIT AND DRIVING METHOD THEREOF, DISPLAY SUBSTRATE AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Jingwen Zhang, Beijing (CN); Yunsheng Xiao, Beijing (CN); Miao Wang, Beijing (CN); Dan Cao, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 80 days.

(21) Appl. No.: 17/424,965

(22) PCT Filed: Nov. 27, 2020

(86) PCT No.: PCT/CN2020/132090
§ 371 (c)(1),
(2) Date: Jul. 22, 2021

(87) PCT Pub. No.: WO2022/109984
PCT Pub. Date: Jun. 2, 2022

(65) Prior Publication Data
US 2023/0137937 A1 May 4, 2023

(51) Int. Cl.
*G09G 3/3258* (2016.01)
*G09G 3/325* (2016.01)
(Continued)

(52) U.S. Cl.
CPC .......... *G09G 3/3258* (2013.01); *G09G 3/325* (2013.01); *G09G 2300/0426* (2013.01);
(Continued)

(58) Field of Classification Search
CPC ................ G09G 3/3258; G09G 3/325; G09G 2300/0426; G09G 2300/0842;
(Continued)

(56) References Cited

U.S. PATENT DOCUMENTS 8,279,203 B2 * 10/2012 Akimoto .............. G09G 3/3258
345/204
9,734,762 B2 * 8/2017 Kishi ................... G09G 3/3225
(Continued)

FOREIGN PATENT DOCUMENTS

CN 108847186 A 11/2018
CN 110610684 A 12/2019
(Continued)

*Primary Examiner* — Tom V Sheng
(74) *Attorney, Agent, or Firm* — Houtteman Law LLC

(57) ABSTRACT

The pixel circuit of the present disclosure includes: a light emitting module configured to emit light; a driving module configured to drive the light emitting module to emit light according to a driving voltage during a light emitting stage; a storage module configured to maintain and provide the driving voltage to the driving module during the light emitting stage; a first transistor, a first electrode of the first transistor being connected to a position where the driving module receives the driving voltage, and a second electrode of the first transistor being not directly connected to a signal source; a second transistor, a first electrode of the second transistor being connected to the first electrode of the first transistor, wherein a structure to which a second electrode of the second transistor is connected is different from a structure to which the second electrode of the first transistor is connected.

25 Claims, 11 Drawing Sheets

(51) Int. Cl.
  *H10K 59/121* (2023.01)
  *H10K 59/12* (2023.01)
(52) U.S. Cl.
  CPC .............. *G09G 2300/0842* (2013.01); *G09G 2310/0251* (2013.01); *G09G 2310/061* (2013.01); *G09G 2320/0233* (2013.01); *G09G 2320/0247* (2013.01); *H10K 59/12* (2023.02); *H10K 59/1213* (2023.02)
(58) Field of Classification Search
  CPC ..... G09G 2310/0251; G09G 2310/061; G09G 2320/0233; G09G 2320/0247; H10K 59/12; H10K 59/1213
  USPC ......................................................... 345/204
  See application file for complete search history.

(56) References Cited

U.S. PATENT DOCUMENTS

| | | | | |
|---|---|---|---|---|
| 10,004,124 B1* | 6/2018 | Ko | ........................ | G09G 3/3233 |
| 2008/0143648 A1* | 6/2008 | Ishizuka | ................ | G09G 3/325 |
| | | | | 345/76 |
| 2012/0019504 A1* | 1/2012 | Han | ..................... | G09G 3/3233 |
| | | | | 345/212 |
| 2014/0340377 A1* | 11/2014 | Kishi | ................... | G09G 3/3283 |
| | | | | 345/76 |
| 2015/0356916 A1* | 12/2015 | Qian | .................... | G09G 3/3233 |
| | | | | 345/78 |
| 2018/0182995 A1* | 6/2018 | Kim | ................... | G09G 3/3233 |
| 2019/0304361 A1* | 10/2019 | Lu | ...................... | H10K 59/1216 |
| 2020/0202783 A1* | 6/2020 | Cheng | ............... | H10K 59/1216 |
| 2021/0242300 A1* | 8/2021 | Kwak | ................ | H10K 59/1216 |
| 2021/0407388 A1* | 12/2021 | Tian | .................... | G09G 3/3233 |
| 2021/0407402 A1* | 12/2021 | Xu | ....................... | G09G 3/3233 |
| 2022/0230592 A1* | 7/2022 | Zhao | .................. | G09G 3/3258 |
| 2022/0375408 A1* | 11/2022 | Dong | ................. | G09G 3/3241 |
| 2022/0376003 A1* | 11/2022 | Wang | ................ | H10K 59/1213 |
| 2022/0415259 A1* | 12/2022 | Qing | .................. | G09G 3/3258 |

FOREIGN PATENT DOCUMENTS

| | | |
|---|---|---|
| CN | 110992880 A | 4/2020 |
| CN | 111179859 A | 5/2020 |
| CN | 111445848 A | 7/2020 |
| CN | 111477179 A | 7/2020 |
| CN | 111489701 A | 8/2020 |
| CN | 111613177 A | 9/2020 |
| CN | 111627387 A | 9/2020 |

\* cited by examiner

-Prior Art-

-Prior Art-

-Prior Art-

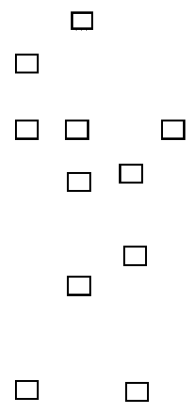
FIG. 18
FIG. 19
FIG. 20
FIG. 21

PIXEL CIRCUIT AND DRIVING METHOD THEREOF, DISPLAY SUBSTRATE AND DISPLAY DEVICE

TECHNICAL FIELD

The embodiment of the present disclosure relates to the field of pixel circuit technology, and in particular relates to a pixel circuit, a driving method thereof, a display substrate and a display device.

BACKGROUND

In an Organic Light Emitting Diode (OLED) display substrate, during a light emitting stage, a certain driving voltage is applied to a gate electrode of a driving transistor, so that the OLED emits light with a corresponding brightness to display. However, during a display stage, a voltage at the gate electrode of the driving transistor may vary due to the presence of leakage current, thereby causing a variation in the brightness of the organic light emitting diode, resulting in a flicker phenomenon, which affects display quality.

SUMMARY

The embodiment of the present disclosure provides a pixel circuit, a driving method thereof, a display substrate and a display device.

In a first aspect, the embodiment of the present disclosure provides a pixel circuit, including:

a light emitting module configured to emit light;

a driving module configured to drive the light emitting module to emit light according to a driving voltage in a light emitting stage;

a storage module configured to maintain the driving voltage and to provide the driving voltage to the driving module in the light emitting stage;

a first transistor, a first electrode of the first transistor being connected to a position where the driving module obtains the driving voltage, and a second electrode of the first transistor being not directly connected to a signal source;

a second transistor, a first electrode of the second transistor being connected to the first electrode of the first transistor, wherein a structure to which a second electrode of the second transistor is connected is different from a structure to which the second electrode of the first transistor is connected; wherein in the light emitting stage, a voltage at the second electrode of the first transistor is lower than that of the first electrode of the first transistor and a voltage at the second electrode of the second transistor is higher than that of the first electrode of the first transistor, a voltage stabilizing capacitor, a first electrode of the voltage stabilizing capacitor being connected to the second electrode of the first transistor, and a second electrode of the voltage stabilizing capacitor being connected to a constant voltage signal source.

In some embodiments, the pixel circuit further includes:

a third transistor, a first electrode of the third transistor being connected to the second electrode of the first transistor, and a gate of the third transistor being connected to a gate of the first transistor;

a fourth transistor, a first electrode of the fourth transistor being connected to the second electrode of the second transistor, and a gate of the fourth transistor being connected to a gate of the second transistor;

wherein the light emitting module includes a light emitting device;

the driving module includes a driving transistor configured to drive the light emitting device to emit light according to a voltage at a gate of the driving transistor;

the storage module includes a storage capacitor, which has a first electrode connected to the gate of the driving transistor and is configured to maintain the driving voltage at the first electrode thereof and provide the driving voltage to the driving module in the light emitting stage.

In some embodiments, the pixel circuit includes a first reset module and a write module;

the first reset module is configured to reset the voltage at the gate of the driving transistor according to signals at an initialization signal terminal and the first reset signal terminal; the first reset module includes:

the first transistor;

the third transistor, the first electrode of the third transistor being connected to the second electrode of the first transistor, a second electrode of the third transistor being connected to the initialization signal terminal and the gate of the third transistor being connected to the gate of the first transistor and the first reset signal terminal;

the write module is configured to write the driving voltage to the first electrode of the storage capacitor according to signals at a gate signal terminal and a data signal terminal; the write module includes:

the second transistor;

the fourth transistor, the first electrode of the fourth transistor being connected to the second electrode of the second transistor, a second electrode of the fourth transistor being connected to the second electrode of the driving transistor and the gate of the fourth transistor being connected to the gate of the second transistor and the gate signal terminal;

a fifth transistor, a first electrode of the fifth transistor being connected to the first electrode of the driving transistor, a second electrode of the fifth transistor being connected to the data signal terminal, and a gate of the fifth transistor being connected to the gate signal terminal;

a sixth transistor, a first electrode of the sixth transistor being connected to a first power signal terminal, a second electrode of the sixth transistor being connected to the first electrode of the driving transistor, and a gate of the sixth transistor being connected to a control signal terminal;

wherein, the driving transistor and the light emitting device are connected in series between the first power signal terminal and a second power signal terminal;

a second electrode of the storage capacitor is connected to the first power signal terminal;

a second electrode of the light emitting device is connected to the second power signal terminal.

In some embodiments, the constant voltage signal source is any one of the initialization signal terminal, the first power signal terminal, and the second power signal terminal.

In some embodiments, the pixel circuit further includes:

a control module configured to control whether the light emitting device emits light according to a signal at the control signal terminal; the control module includes: a seventh transistor, a first electrode of the seventh transistor being connected to the second electrode of the driving transistor, a second electrode of the seventh transistor being connected to the first electrode of the light emitting device, and a gate of the seventh transistor being connected to the control signal terminal;

a second reset module configured to reset the voltage at the first electrode of the light emitting device according to signals at a second reset signal terminal and the initialization signal terminal; the second reset module includes: an eighth transistor, a first electrode of the eighth transistor being connected to the first electrode of the light emitting device, a second electrode of the eighth transistor being connected to the initialization signal terminal, and a gate of the eighth transistor being connected to the second reset signal terminal.

In some embodiments, the driving transistor, the first transistor, the second transistor, the third transistor, the fourth transistor, the fifth transistor, the sixth transistor, the seventh transistor, and the eighth transistor are all P-type transistors;

or, the driving transistor, the first transistor, the second transistor, the third transistor, the fourth transistor, the fifth transistor, the sixth transistor, the seventh transistor, and the eighth transistor are all N-type transistors.

In a second aspect, the embodiment of the present disclosure provides a driving method for a pixel circuit, wherein the pixel circuit is the pixel circuit of any one of embodiments of the first aspect, the driving method for the pixel circuit includes steps of:

causing the storage module to maintain the driving voltage and to provide the driving voltage to the driving module in the light emitting stage.

In some embodiments, the driving method for the pixel circuit includes steps of:

continuously providing an initialization signal to the initialization signal terminal, continuously providing a first power signal to the first power signal terminal, and continuously providing a second power signal to the second power signal terminal;

in a reset stage, providing a turn-on signal to the first reset signal terminal, providing a turn-off signal to the gate signal terminal, and providing a turn-off signal to the control signal terminal;

in a write stage, providing a turn-off signal to the first reset signal terminal, providing a turn-on signal to the gate signal terminal, providing a turn-off signal to the control signal terminal, and providing a data signal to the data signal terminal;

in a light emitting stage, providing a turn-off signal to the first reset signal terminal, providing a turn-off signal to the gate signal terminal, and providing a turn-on signal to the control signal terminal.

In some embodiments, the driving method for the pixel circuit includes steps of:

in the reset stage, providing a turn-off signal to the second reset signal terminal;

in the write stage, providing a turn-on signal to the second reset signal terminal;

in the light emitting stage, providing a turn-off signal to the second reset signal terminal.

In a third aspect, the embodiment of the present disclosure provides a display substrate, including:

a base plate;

a plurality of sub-pixels on the base plate, at least some of the plurality of sub-pixels including the pixel circuits of any one of embodiments of the first aspect.

In some embodiments, the first electrode of the voltage stabilizing capacitor includes: a connection portion connected between the first electrode of the third transistor and the second electrode of the first transistor; and an additional portion connected to the connection portion.

In some embodiments, the first electrode of the voltage stabilizing capacitor and the second electrode of the first transistor are in a same layer and connected as a whole.

In some embodiments, the first electrode of the voltage stabilizing capacitor is in a same layer as an active region of the driving transistor, and is made of a conductorized semiconductor material;

the second electrode of the first transistor is in a same layer as the active region of the driving transistor, and is made of a conductorized semiconductor material.

In some embodiments, the second electrode of the voltage stabilizing capacitor and the initialization signal terminal are in a same layer and are connected as a whole.

In some embodiments, in a direction gradually distal to the base plate, the display substrate sequentially includes:

the active region of the driving transistor and the first electrode of the voltage stabilizing capacitor;

a gate insulating layer;

the gate of the driving transistor;

a first interlayer insulating layer;

the second electrode of the voltage stabilizing capacitor and the initialization signal terminal.

In some embodiments, the initialization signal terminal includes a first initialization signal terminal and a second initialization signal terminal in a same layer and parallel to and separated from each other;

the second electrode of the eighth transistor is connected to the first initialization signal terminal;

the second electrode of the third transistor is connected to the second initialization signal terminal.

In some embodiments, the first electrode of the voltage stabilizing capacitor extends along a first direction;

the data signal terminal and/or the first power signal terminal extend along a second direction; the first direction intersects the second direction.

In some embodiments, the first reset signal terminal extends in the first direction;

a first reset signal terminal of a pixel circuit is at least partially multiplexed as a second reset signal terminal of a pixel circuit adjacent to the pixel circuit along the second direction; the first direction intersects the second direction.

In some embodiments, the second electrode of the storage capacitor includes a lateral connection structure extending along a first direction; the lateral connection structures of at least some of the pixel circuits adjacent to each other in the first direction are connected to each other;

the first power signal terminal extends along a second direction; the first direction intersects the second direction.

In some embodiments, the display substrate further includes:

an auxiliary conductive structure overlapped with the first power signal terminal; wherein at least one insulating layer is between the auxiliary conductive structure and the first power signal terminal, and the auxiliary conductive structure is connected to the first power signal terminal through a via in the insulating layer.

In some embodiments, in a direction gradually distal to the base plate, the display substrate sequentially includes:

a semiconductor layer, including: the first electrode, the second electrode, and an active region of the driving transistor; the first electrode, the second electrode, and an active region of the first transistor; the first electrode, the second electrode, and an active region of the second transistor; the first electrode, the second electrode, and an active region of the third transistor; the first electrode, the second electrode, and an active region of the fourth transistor; the first electrode, the second electrode, and an active region of the fifth transistor; the first electrode, the second electrode, and an active region of the sixth transistor; the first electrode, the second electrode, and an active region of the seventh transistor; the first electrode, the second electrode, and an active region of the eighth transistor; and the first electrode of the voltage stabilizing capacitor, wherein the first electrode of the voltage stabilizing capacitor and the second electrode of the first transistor are connected as a whole, and are made of a conductorized semiconductor material;

a gate insulating layer;

a first gate layer including: the gate of the driving transistor, the gate of the first transistor, the gate of the second transistor, the gate of the third transistor, the gate of the fourth transistor, the gate of the fifth transistor, the gate of the sixth transistor, the gate of the seventh transistor, the gate of the eighth transistor, the first reset signal terminal, the second reset signal terminal, the control signal terminal, and the first electrode of the storage capacitor;

a first interlayer insulating layer;

a second gate layer including: the initialization signal terminal, the second electrode of the voltage stabilizing capacitor and the second electrode of the storage capacitor; wherein the second electrode of the voltage stabilizing capacitor and the initialization signal terminal are connected as a whole;

a second interlayer insulating layer;

a first source-drain layer including: the first power signal terminal, the data signal terminal and a first light emitting access structure; wherein the first power signal terminal is connected to the second electrode of the storage capacitor through a via in the second interlayer insulating layer, and is connected to the first electrode of the sixth transistor through vias in the gate insulating layer, the first interlayer insulating layer and the second interlayer insulating layer; the data signal terminal is connected to the second electrode of the fifth transistor through vias in the gate insulating layer, the first interlayer insulating layer and the second interlayer insulating layer, and the first light emitting access structure is connected to the second electrode of the seventh transistor through vias in the gate insulating layer, the first interlayer insulating layer and the second interlayer insulating layer;

a first planarization layer;

a second source-drain layer including: an auxiliary conductive structure and a second light emitting access structure; wherein the auxiliary conductive structure is overlapped with the first power signal terminal and is connected to the first power signal terminal through a via in the first planarization layer; the second light emitting access structure is connected to the first light emitting access structure through a via in the first planarization layer;

a second planarization layer;

the first electrode of the light emitting device connected to the second light emitting access structure through a via in the second planarization layer.

In some embodiments, the second gate layer further includes:

a shielding structure connected to the first power signal terminal through a via in the second interlayer insulating layer, wherein the shielding structure is overlapped and insulated with the first electrode of the first transistor and the second electrode of the fifth transistor.

In some embodiments, the first source-drain layer further includes:

a first connection structure connected to the second electrode of the eighth transistor through vias in the gate insulating layer, the first interlayer insulating layer and the second interlayer insulating layer, and connected to the initialization signal terminal through a via in the second interlayer insulating layer;

a second connection structure connected to the second electrode of the third transistor through vias in the gate insulating layer, the first interlayer insulating layer, and the second interlayer insulating layer, and connected to the initialization signal terminal through a via in the second interlayer insulating layer;

a third connection structure connected to the gate of the driving transistor through vias in the first interlayer insulating layer and the second interlayer insulating layer, and connected to the first electrode of the first transistor through vias in the gate insulating layer, the first interlayer insulating layer and the second interlayer insulating layer.

In some embodiments, a capacitance of the voltage stabilizing capacitor is not lower than 8 fF and not more than one fourth of a capacitance of the storage capacitor.

In a fourth aspect, the embodiment of the present disclosure provides a display device, including:

the display substrate of any one of embodiments of the third aspect.

BRIEF DESCRIPTION OF DRAWINGS

The accompanying drawings are included to provide a further understanding of the embodiments of the present disclosure, and are incorporated in and constitute a part of this specification, serve to explain the present disclosure together with embodiments of the present disclosure and are not intended to limit the present disclosure. The above and other features and advantages will become more apparent to a person skilled in the art by describing in detail exemplary embodiments thereof with reference to drawings, in which:

FIG. 18 is a schematic diagram illustrating a distribution of vias in a first interlayer insulating layer of a pixel circuit in a display substrate according to an embodiment of the present disclosure;

FIG. 19 is a schematic diagram illustrating a distribution of vias in a second interlayer insulating layer of a pixel circuit in a display substrate according to an embodiment of the present disclosure;

FIG. 20 is a schematic diagram of a distribution of vias in a first planarization layer (which is also a passivation layer) of a pixel circuit in a display substrate according to an embodiment of the present disclosure; and FIG. 21 is a schematic diagram of a distribution of a via in a second planarization layer of a pixel circuit in a display substrate according to an embodiment of the present disclosure.

Figure 1:
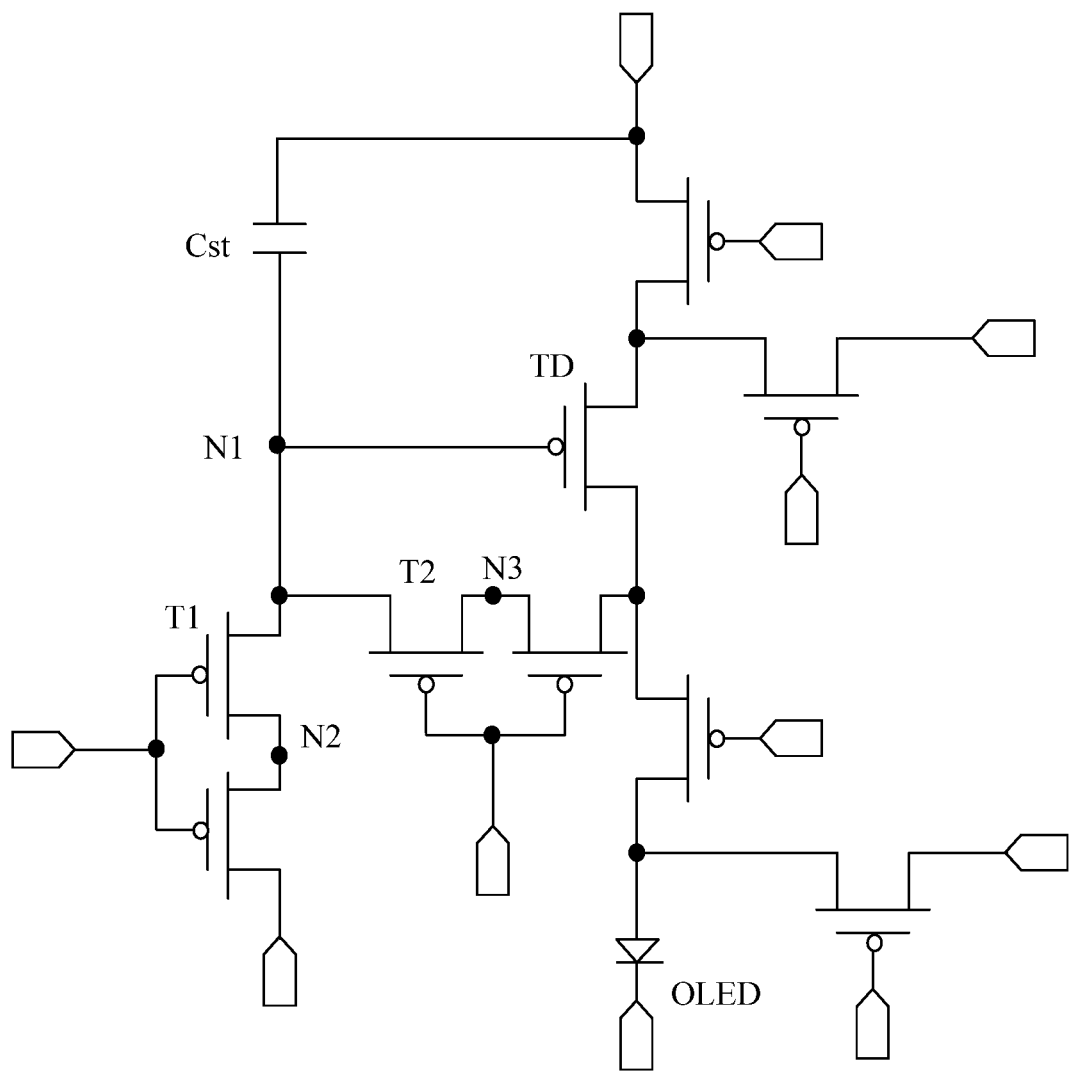
FIG. 1 is a circuit diagram of a pixel circuit in the related art.

The reference numerals used in the embodiments of the present disclosure have the following meanings:

TD, driving transistor; T1, first transistor; T2, second transistor; T3, third transistor; T4, fourth transistor; T5, fifth transistor; T6, sixth transistor; T7, seventh transistor; T8, eighth transistor; OLED, organic light emitting diode;

Cst, storage capacitor; C1, voltage stabilizing capacitor; N1, first node; N2, first node; N3, third node;

GATE, gate signal terminal; DATA, data signal terminal; RESET1, first reset signal terminal; RESET2, second reset signal terminal; INIT, initialization signal terminal; INIT1, first initialization signal terminal; INIT2, second initialization signal terminal; EM, control signal terminal; VDD, first power signal terminal; VSS, second power signal terminal; VDC, constant voltage signal source;

11. connection portion; 12. additional portion; 2. light emitting device; 31. auxiliary conductive structure; 32. lateral connection structure; 331. first light emitting access structure; 332. second light emitting access structure; 34. shielding structure; 351. first connection structure; 352. second connection structure; 353. third connection structure.

DETAIL DESCRIPTION OF EMBODIMENTS

To enable a person skilled in the art to better understand technical solutions of the present disclosure, a pixel circuit, a driving method thereof, a display substrate and a display device according to the present disclosure will be described below in detail with reference to the accompanying drawings.

The embodiments of the present disclosure will be described more fully hereinafter with reference to the accompanying drawings, but the illustrative embodiments may be implemented in different forms and should not be construed as being limited to the embodiments set forth herein. Rather, these embodiments are provided so that the present disclosure will be thorough and complete, and the scope of the present disclosure will be fully conveyed to one of ordinary skill in the art.

Embodiments of the present disclosure may be described with reference to plan views and/or cross-sectional views by way of idealized schematic diagrams of the present disclosure. Accordingly, the schematic diagrams may be modified in accordance with manufacturing techniques and/or tolerances.

Embodiments of the present disclosure and features of the embodiments may be combined with each other without conflict.

The terms used in the present disclosure are for describing specific embodiments only and are not intended to limit the present disclosure. As used in the present disclosure, the term "and/or" includes any and all combinations of one or more associated listed items. As used in the present disclosure, singular forms "a", "an" and "the" are intended to include the plural form, unless the context clearly indicates otherwise. As used in the present disclosure, the terms "including", "comprising," "made of" specify the presence of the features, integers, steps, operations, elements, and/or components, but do not exclude the presence or addition of one or more other features, integers, steps, operations, elements, components, and/or groups thereof.

Unless otherwise defined, all terms (including science and technology terms) used in the present disclosure have a same meaning as those commonly understood by one of ordinary skill in the art. It will be further understood that terms, such as those defined in commonly used dictionaries, should be interpreted as having a meaning consistent with their meaning in the context of the art and the present disclosure, and will not be interpreted in an idealized or overly formal sense, unless expressly so defined herein.

The ordinals such as "first", "second", and "third" in the present specification are provided to avoid confusion of the constituent elements and do not limit the number of the constituent elements.

In this specification, for convenience, the terms "middle", "upper", "lower", "front", "rear", "vertical", "horizontal", "top", "bottom", "inner", "outer", and the like indicating the orientation or positional relationship are used to explain the positional relationship among the constituent elements with reference to the drawings, only for the convenience of description and simplification of description, but such terms do not indicate or imply that the indicated device or element must have a specific orientation, be constructed in a specific orientation, and be operated, and thus, should not be construed as limiting the present disclosure. The positional relationship of the constituent elements is changed as appropriate in accordance with the direction of each constituent element. Therefore, the words and phrases described in the specification are not limited thereto, and may be replaced as appropriate depending on the case.

The embodiment of the present disclosure is not limited to the embodiments shown in the drawings, but includes modifications of configurations formed based on a manufacturing process. Thus, regions illustrated in the drawings have schematic properties, and shapes of the regions shown in the drawings illustrate specific shapes of regions of elements, but are not intended to be limiting.

Description of Technical Terms

In the present disclosure, unless otherwise specified, the following technical terms should be understood in accordance with the following explanations:

"Transistor" may be specifically a "Thin Film Transistor (TFT)" which refers to a device including at least three terminals, i.e., a gate, a drain, and a source, and an active region connected between the source and the drain; in which the drain and the source may be insulated from each other by controlling the voltage relationship among the gate, the source, and the drain, and current may not pass (i.e., the transistor is turned off), and current may flow from the source to the drain through the active region (i.e., the transistor is turned on).

"Drain and source of the transistor" are distinguished by the flow direction of the current, so the source and drain for the transistor device itself are not definite without signal. Therefore, in the embodiment of the present disclosure, first and second electrodes represent two electrodes, i.e., the source and the drain of the transistor, but there is no necessary correspondence between the first and second electrodes and the source and the drain.

"Signal terminal" refers to a structure of the pixel circuit, which is connected to another signal source outside to provide a corresponding signal. Thus, the signal terminal is not necessarily a "terminal" or a "connection terminal", but may include all structures connected to the corresponding signal source. For example, the signal terminal may be integrated with the corresponding signal line, or a portion of the signal line in the pixel circuit is the signal terminal. Meanwhile, the signal terminal and the structure connected thereto may be integrated. For example, if the signal terminal (e.g., a gate signal terminal) provides a gate signal for the transistor, a portion of the signal terminal overlapping with the active region of the transistor may also be a gate of the transistor.

"Signal source" refers to any "source" that may provide a desired signal, which may be the above "signal terminal".

"Two connection structures" means that two structures are directly in contact with and connected with each other, or indirectly connected with each other through other conductive structures. In the embodiments of the present disclosure, however, structures indirectly connected through a transistor or the like which is not necessarily conductive are not considered to be connected with each other.

"Node" refers to all structures in a pixel circuit that may be electrically viewed as being integrated. For example, the electrodes connected to each other and the connection structure between the electrodes are both one "node", but the first electrode and the second electrode of one transistor are different nodes unless being connected to each other.

"On signal" refers to a signal that when applied to the gate of a transistor, may turn the transistor on. For example, for a P-type transistor, the on signal is a low level signal, and for an N-type transistor, the on signal is a high level signal.

"Off signal" refers to a signal that when applied to the gate of a transistor, may turn the transistor off. For example, for a P-type transistor, the off signal is a high level signal, and for an N-type transistor, the off signal is a low level signal.

"A plurality of structures are provided in a same layer", which means that the plurality of structures are formed from a same layer of material and thus are in a same layer in a multilayer relationship, but does not mean that distances between the plurality of structures and the base plate are same, nor that they are completely identical to the other layers on the base plate.

"Patterning process" refers to a step of forming a structure having a specific pattern, which may be a photolithography process including one or more steps of forming a material layer, coating a photoresist, exposing, developing, etching, stripping the photoresist, and the like. Alternatively, the patterning process may be an imprinting process, an inkjet printing process, and the like.

PRIOR ART

In some related art, each sub-pixel of the organic light emitting diode (OLED) display substrate includes a pixel circuit including an organic light emitting diode for emitting light, i.e., the organic light emitting diode emits light required for each sub-pixel.

One possible structure of the pixel circuit may be seen in FIG. 1. A driving transistor TD controls a current flowing through the driving transistor TD according to a voltage at a gate electrode of the driving transistor TD, which is a current holed for driving the organic light emitting diode OLED to emit light. In this way, the driving transistor TD drives the organic light emitting diode OLED to emit light according to a driving voltage. During a light emitting stage, a storage capacitor Cst maintains the gate electrode of the driving transistor TD at a desired driving voltage.

Referring to FIG. 1, the gate electrode of the driving transistor TD is also connected to a second node N2 and a third node N3 through a first transistor T1 and a second transistor T2, respectively. During the light emitting stage, voltages at the second node N2 and the third node N3 are generally different. For example, the voltage at the second node N2 may be lower than that at the first node N1, and the voltage at the third node N3 is higher than that at the first node N1. Since a certain leakage current inevitably exists in the first transistor T1 and the second transistor T2, the second node N2 gradually "pulls down" the voltage at the first node N1 due to the leakage current in the first transistor T1, and the third node N3 gradually "pulls up" the voltage at the first node N1 due to the leakage current in the second transistor T2. Also, the action of "pulling up" by the third node N3 is typically stronger than the action of "pulling down" by the second node N2.

Figure 2:
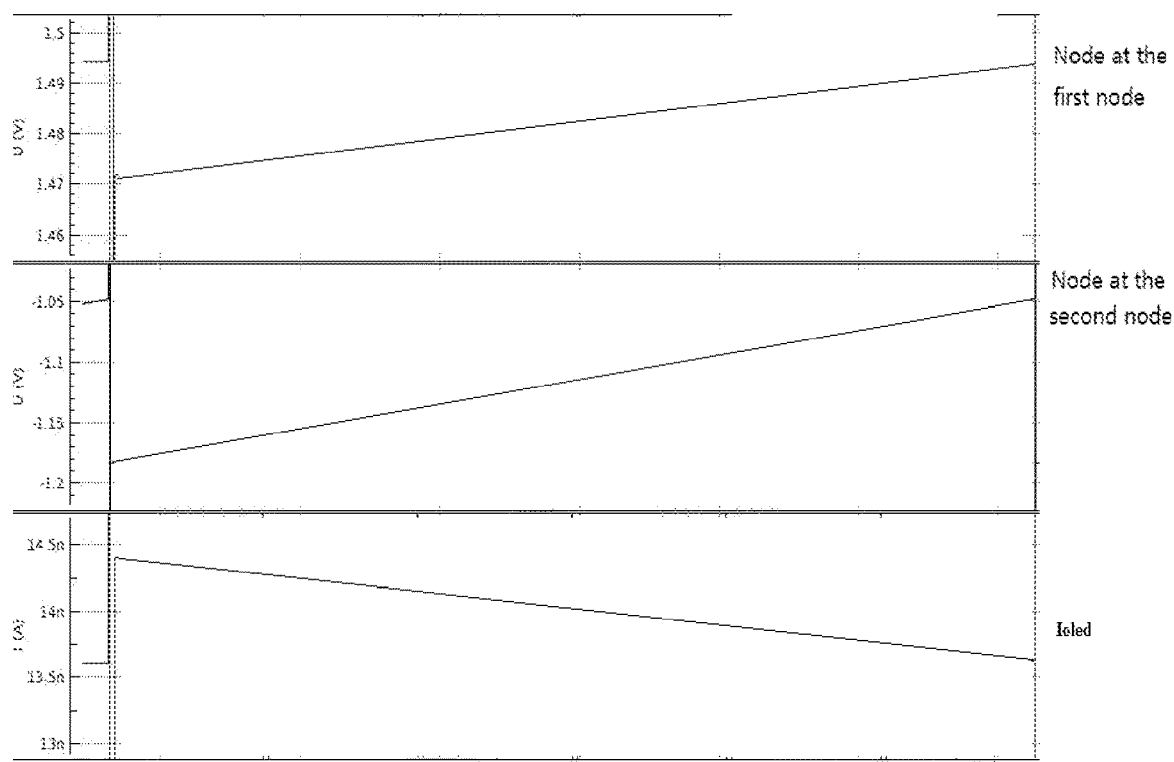
FIG. 2 is a diagram showing a simulation result of some signals varying over time in a pixel circuit in the related art.

Accordingly, in the pixel circuit in the related art, simulation results of some signals varying over time during the light emitting stage may be seen in FIG. 2. It may be seen that during the light emitting stage, the voltage at the first node N1 is gradually increased, that is, the driving voltage is gradually increased, so that the driving current holed flowing through the organic light emitting diode OLED is decreased. Further, brightness variation of light emitted from the pixel circuits in a plurality of frames may be seen in FIG. 2. It may be seen that a brightness of light emitted from the organic light emitting diode OLED is decreased in each frame (in each light emitting stage).

Therefore, when the brightness is decreased to a degree that may be perceived by human eyes, a flicker phenomenon may be caused, which may affect the display quality.

Detailed Description of the Embodiment of the Present Disclosure

In a first aspect, referring to FIGS. 4 to 8, an embodiment of the present disclosure provides a pixel circuit, which includes:

a light emitting module configured to emit light;

a driving module configured to drive the light emitting module to emit light according to a driving voltage in a light emitting stage;

a storage module configured to maintain the driving voltage and to provide the driving voltage to the driving module in the light emitting stage;

a first transistor T1, a first electrode of the first transistor T1 being connected to a position where the driving module obtains the driving voltage, and a second electrode of the first transistor T1 being not directly connected to a signal source; wherein in the light emitting stage, a voltage at the second electrode of the first transistor T1 is lower than that of the first electrode of the first transistor T1;

a second transistor T2, a first electrode of the second transistor T2 being connected to the first electrode of the first transistor T1, wherein a structure to which a second electrode of the second transistor T2 is connected is different from a structure to which the second electrode of the first transistor T1 is connected; a voltage at the second electrode of the second transistor T2 is higher than that of the first electrode of the first transistor T1, a voltage stabilizing capacitor C1, a first electrode of the voltage stabilizing capacitor C1 being connected to the second electrode of the first transistor T1, and a second electrode of the voltage stabilizing capacitor C1 being connected to a constant voltage signal source VDC.

In the pixel circuit of the embodiment of the present disclosure, the driving module drives the light emitting module to emit light according to the driving voltage (e.g., a voltage at a gate of a driving transistor TD) in the light emitting stage, and the storage module is configured to maintain and provide the driving voltage in the light emitting stage.

First electrodes of the first transistor T1 and the second transistor T2 are connected to a position (e.g., a first node N1, i.e., the gate of the driving transistor TD) where the driving module provides the driving voltage, and second electrodes of the first transistor T1 and the second transistor T2 are connected to different positions (e.g., a second node N2 and a third node N3, respectively); thus, the second node N2 may change a voltage at the first node N1 due to a leakage current at the first transistor T1, and the third node N3 may change the voltage at the first node N1 due to a leakage current of the second transistor T2.

In the light emitting stage, for both the voltage at the second node N2 (the second electrode of the first transistor T1) and the voltage at the third node N3 (the second electrode of the second transistor T2), the former is generally lower than the voltage (driving voltage) at the first node N1 so that the voltage at the first node N1 is pulled down; and the latter is higher than the voltage (driving voltage) at the first node N1 so that the voltage at the first node N1 is pulled up.

Figure 3:
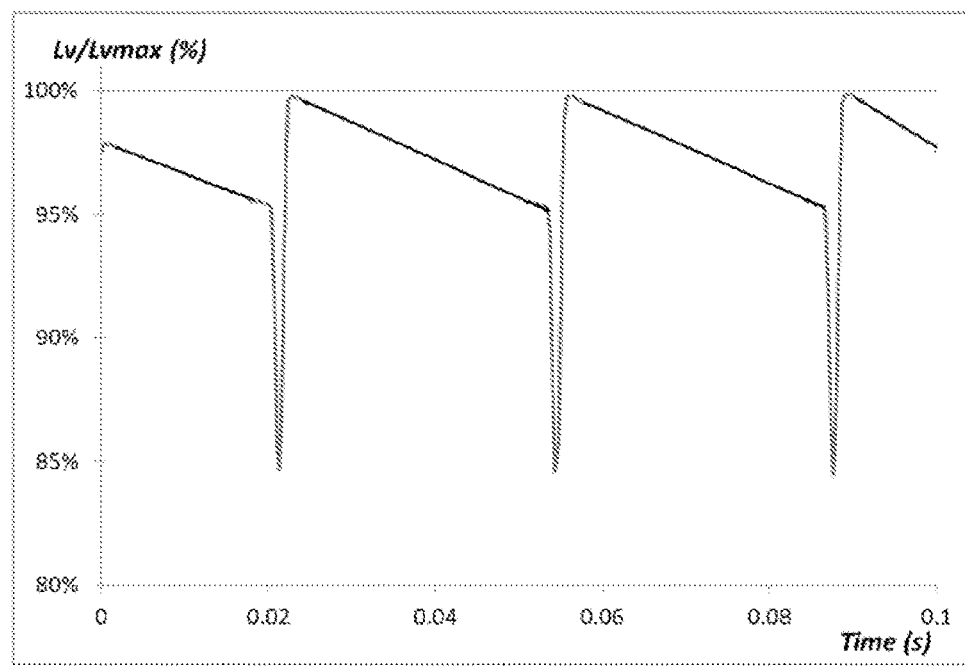
FIG. 3 is a diagram showing a simulation result of lighting brightness varying over time in a pixel circuit in the related art.

As before, in some related arts, the "pulling up" capability of the third node N3 is stronger than the "pulling down" capability of the second node N2, so that referring to FIGS. 2 and 3, the voltage (driving voltage) at the first node N1 may gradually rise in the light emitting stage, thereby causing the variation of the display brightness.

In the embodiment of the present disclosure, the second electrode (the second node N2) of the first transistor T1 is not directly connected to the signal source, so the voltage itself is variable in the light emitting stage. In the embodiment of the present disclosure, the voltage stabilizing capacitor C1 is connected to the second electrode (the second node N2) of the first transistor T1, and the other electrode (the second electrode) of the voltage stabilizing capacitor C1 is connected to the constant voltage signal source VDC, that is, connected to any one of the signal sources providing a constant voltage in one frame. Obviously, since the second electrode of the voltage stabilizing capacitor C1 is provided with the constant voltage signal, it may prevent the voltage at the first electrode (i.e. the second node N2) of the capacitor from changing, and the larger a capacitance value of the voltage stabilizing capacitor C1 is, the stronger the function of prevent the voltage from changing is.

Of course, in practice, the structure at the second node N2 itself may have a certain parasitic capacitor, but the parasitic capacitor has a small capacitance value, generally not exceeding 1.5 fF (femtoFaraday), and the other electrode is not connected to the constant voltage signal source VDC, so the parasitic capacitor is different from the above voltage stabilizing capacitor C1.

It may be seen that in the embodiment of the present disclosure, by adding a "capacitor (voltage stabilizing capacitor C1)" at the second electrode (second node N2) of the first transistor T1, the signal stability at the second node N2 may be enhanced, so that a "lower" voltage is maintained in the light emitting stage, to enhance the capability of "pulling down" the voltage at the first node N1, such that the "pulling down" and "pulling up" actions on the first node N1 tend to be balanced, and the voltage (driving voltage) at the first node N1 may be better kept stable in the light emitting stage, so as to reduce the variation of the brightness of the light emitted by a light emitting device 2, to improve or avoid the flicker phenomenon, and to improve the display quality.

Figure 6:
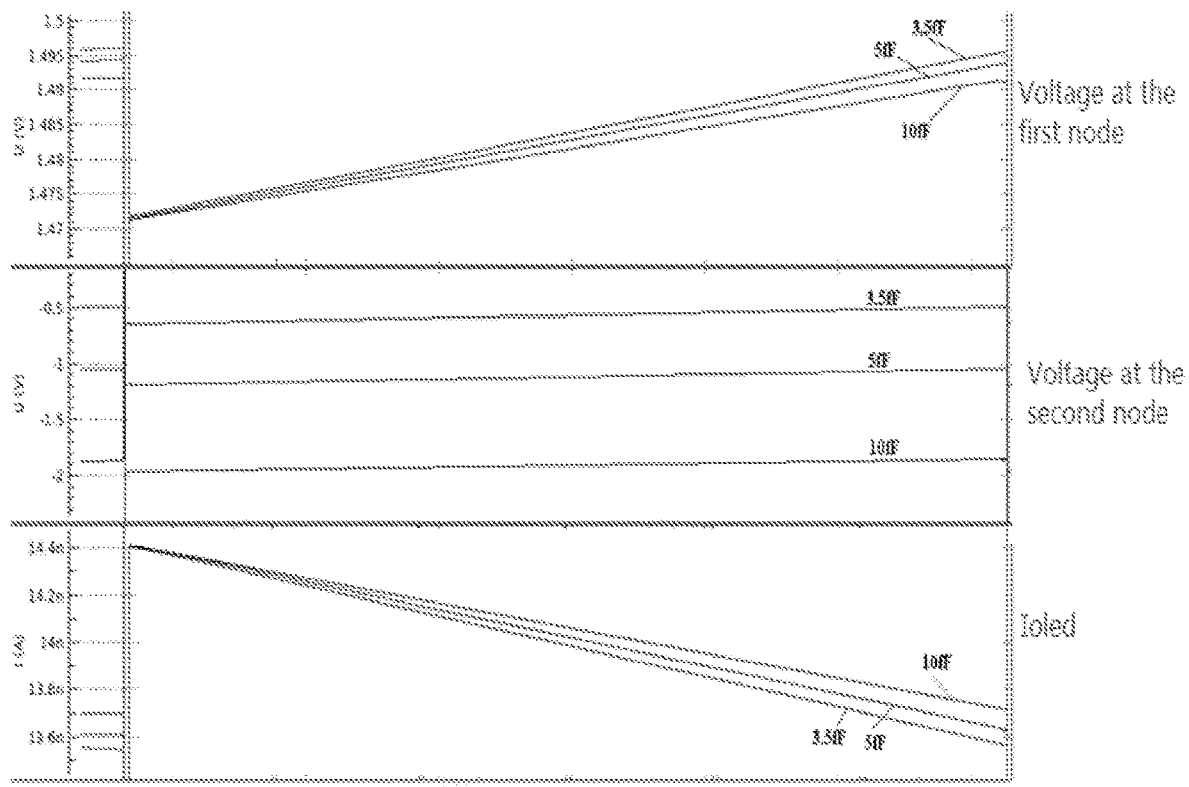
FIG. 6 is a diagram showing a simulation result of some signals varying over time with different capacitance values of a voltage stabilizing capacitor in a pixel circuit according to an embodiment of the present disclosure.

Therefore, in the pixel circuit of the embodiment of the present disclosure, when the capacitance values of the voltage stabilizing capacitor are 3.5 fF, 5 fF, and 10 fF, respectively, a simulation result of a change of some signals with time in the light emitting stage is shown in FIG. 6.

The voltage at the second node N2 may "jump" higher due to coupling with other signals (such as a signal at a first reset signal terminal RESET1), so that an initial voltage at the second node N2 is higher in the light emitting stage. Referring to FIG. 6, the larger the capacitance value of the voltage stabilizing capacitor C1 is, the lower the initial voltage at the second node N2 is in the light emitting stage, which means that by adding the voltage stabilizing capacitor C1, the capability of the second node N2 to resist the above "jump" may be improved, so that the initial voltage at the second node N2 is reduced in the light emitting stage. That is, the voltage at the second node N2 may be relatively kept at a "lower" level in the light emitting stage, the capability of "pulling down" the voltage (driving voltage) at the first node N1 by the second node N2 is improved, such that the variation of the voltage at the first node N1 is reduced, the driving current holed is stabilized. That is, the light emitting brightness of the light emitting device 2 is stabilized in the light emitting stage, so as to improve or avoid the flicker phenomenon, and to improve the display quality.

Moreover, while the second node N2 "pulls down" the voltage at the first node N1, the voltage at the second node N2 itself is also "pulled up", but as may be seen from FIG. 6, the larger the capacitance value of the stabilizing capacitor C1 is, the smaller a "slope" of a line corresponding to the voltage at the second node N2 is, that is, the smaller the degree of "pulling up" the voltage at the second node N2 is, which means that by adding the stabilizing capacitor C1, a rate of "pulling up" the voltage at the second node N2 may be reduced, so as to further enhance the capability of "pulling down" the voltage at the first node N1, so that the change of the voltage at the first node N1 is smaller, and the display quality is further improved.

Figure 4:
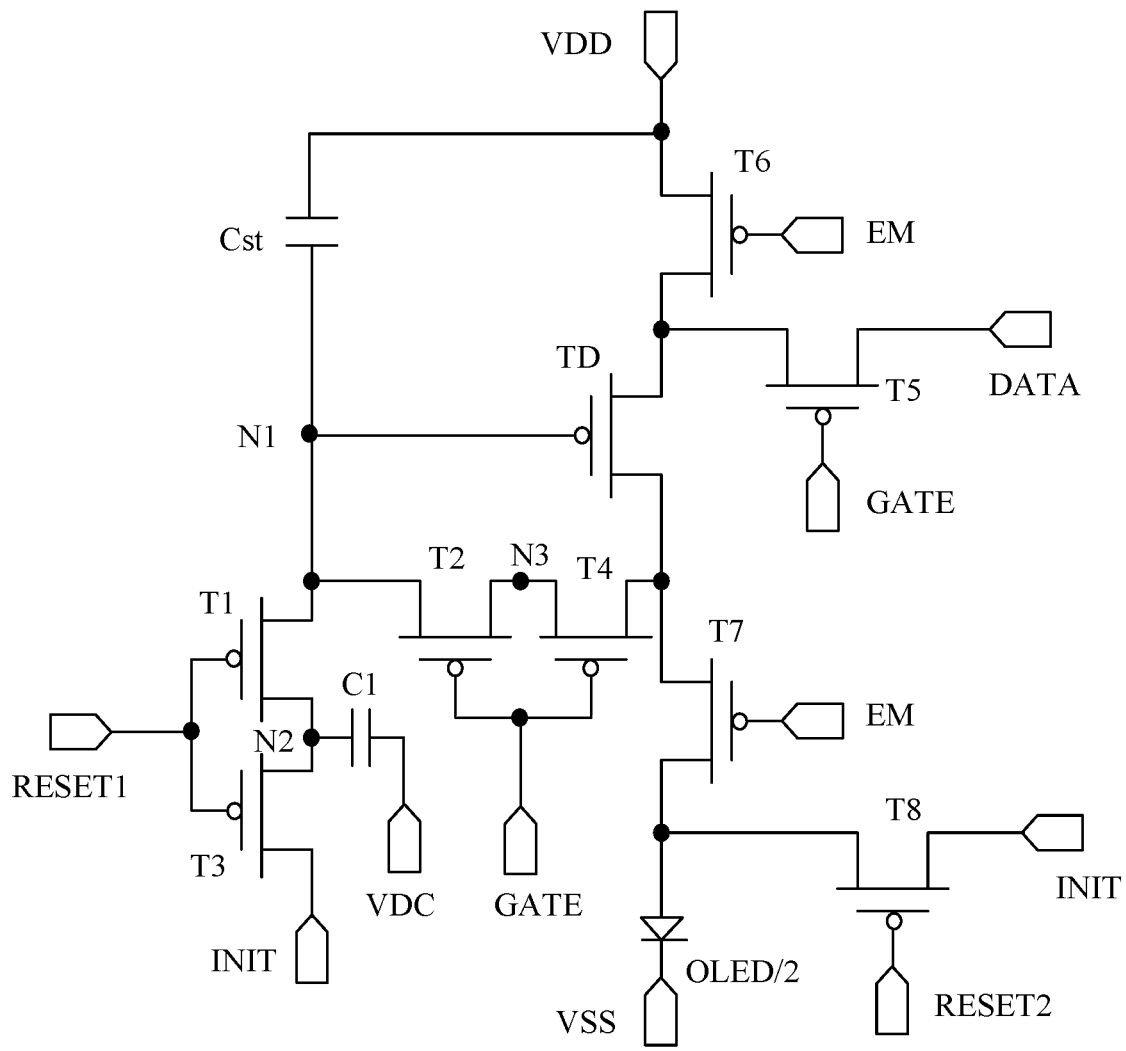
FIG. 4 is a circuit diagram of a pixel circuit according to an embodiment of the present disclosure.
Figure 7:
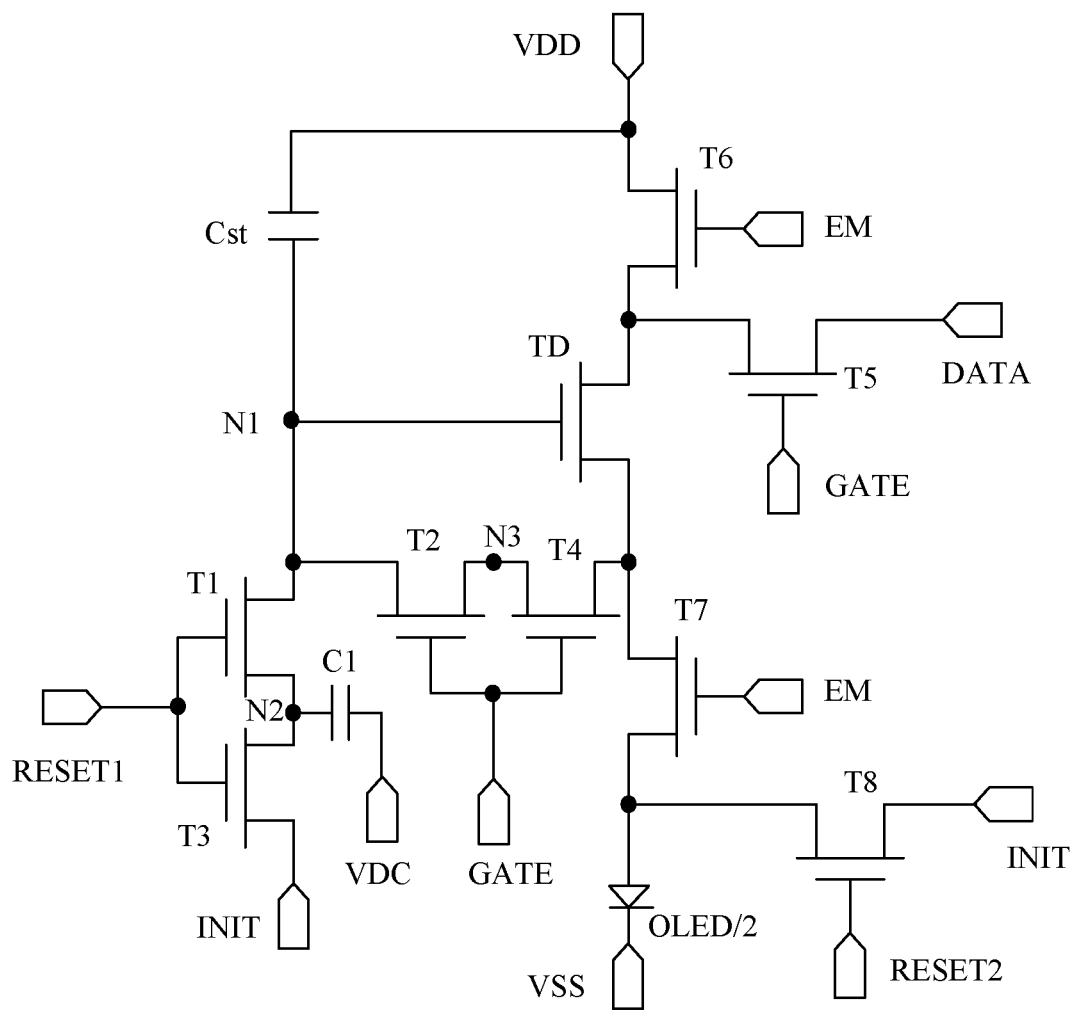
FIG. 7 is a circuit diagram of a pixel circuit according to an embodiment of the present disclosure.

Referring to FIGS. 4 and 7, some useful specific forms of the pixel circuit of the embodiment of the present disclosure will be described below.

In some embodiments, the pixel circuit further includes: a third transistor T3, a first electrode of the third transistor T3 being connected to the second electrode of the first transistor T1, and a gate of the third transistor T3 being connected to a gate of the first transistor T1.

In the embodiment of the present disclosure, the above second node N2 may be a node between the first transistor T1 and the third transistor T3, and the gates of the first transistor T1 and the third transistor T3 are connected to each other, forming a "double-gate transistor", i.e., the second node N2 may be an intermediate node of the double-gate transistor.

The intermediate node of the double-gate transistor is not directly connected to other signal sources, so that the double-gate transistor has a weak capability of maintaining the voltage of the double-gate transistor, and the present disclosure is more suitable for adopting the voltage stabilizing capacitor C1 of the embodiment of the present disclosure.

In some embodiments, the pixel circuit further includes: a fourth transistor T4, a first electrode of the fourth transistor T4 being connected to the second electrode of the second transistor T2, and a gate of the fourth transistor T4 being connected to a gate of the second transistor T2.

In the embodiment of the present disclosure, the above third node N3 may be a node between the second transistor T2 and the fourth transistor T4, and the gates of the second transistor T2 and the fourth transistor T4 are connected to each other, forming a "dual-gate transistor", i.e., the third node N3 may be an intermediate node of the dual-gate transistor.

In some embodiments, the light emitting module includes a light emitting device 2;

the driving module includes a driving transistor TD configured to drive the light emitting device 2 to emit light according to a voltage at a gate of the driving transistor TD;

the storage module includes a storage capacitor Cst, a first electrode of which is connected to the gate of the driving transistor TD, and the storage capacitor Cst is configured to maintain the driving voltage at the first electrode thereof and provide the driving voltage to the driving module in the light emitting stage.

In some embodiments, the light emitting device 2 is an organic light emitting diode OLED.

As a manner of the embodiment of the present disclosure, the driving module may include the driving transistor TD, the storage module includes the storage capacitor Cst, and the light emitting device 2 may be the organic light emitting diode OLED.

In the embodiment of the present disclosure, it will be described by taking an example in which the light emitting device 2 is the organic light emitting diode OLED. Alternatively, other forms of the light emitting device 2 are also possible.

In some embodiments, the pixel circuit includes a first reset module and a write module;

the first reset module is configured to reset the voltage at the gate of the driving transistor TD according to signals at an initialization signal terminal INIT and the first reset signal terminal RESET1; the first reset module includes:

the first transistor T1;

the third transistor T3, the first electrode of the third transistor T3 being connected to the second electrode of the first transistor T1, a second electrode of the third transistor T3 being connected to the initialization signal terminal INIT and the gate of the third transistor T3 being connected to the gate of the first transistor T1 and the first reset signal terminal RESET1;

the write module is configured to write the driving voltage to the first electrode of the storage capacitor Cst according to signals at a gate signal terminal GATE and a data signal terminal DATA; the write module includes:

the second transistor T2;

the fourth transistor T4, the first electrode of the fourth transistor T4 being connected to the second electrode of the second transistor T2, a second electrode of the fourth transistor T4 being connected to the second electrode of the driving transistor TD and the gate of the fourth transistor T4 being connected to the gate of the second transistor T2 and the gate signal terminal GATE;

a fifth transistor T5, a first electrode of the fifth transistor T5 being connected to the first electrode of the driving transistor TD, a second electrode of the fifth transistor T5 being connected to the data signal terminal DATA, and a gate electrode of the fifth transistor T5 being connected to the gate signal terminal GATE;

a sixth transistor T6, a first electrode of the sixth transistor T6 being connected to a first power signal terminal VDD, a second electrode of the sixth transistor T6 being connected to the first electrode of the driving transistor TD, and a gate of the sixth transistor T6 being connected to a control signal terminal EM;

wherein, the driving transistor TD and the light emitting device 2 are connected in series between the first power signal terminal VDD and a second power signal terminal VSS;

a second electrode of the storage capacitor Cst is connected to the first power signal terminal VDD;

a second electrode of the light emitting device 2 is connected to the second power signal terminal VSS.

The first power signal terminal VDD and the second power signal terminal VSS are configured to provide an operating voltage to the light emitting device 2 for displaying.

For example, the first power signal terminal VDD may provide a first power signal Vdd, or a positive voltage signal, and the second power signal terminal VSS may provide a second power signal Vdd, or a negative voltage signal (e.g., a ground signal). Thus, the first electrode of the light emitting device 2 may be its positive electrode (e.g. an anode of the organic light emitting diode OLED) and the second electrode of the light emitting device 2 may be its negative electrode (e.g. a cathode of the organic light emitting diode OLED).

In some embodiments, the pixel circuit further includes a control module configured to control whether the light emitting device 2 emits light according to a signal at the control signal terminal EM; the control module includes:

a seventh transistor T7, a first electrode of the seventh transistor T7 being connected to the second electrode of the driving transistor TD, a second electrode of the seventh transistor T7 being connected to the first electrode of the light emitting device 2, and a gate of the seventh transistor T7 being connected to the control signal terminal EM.

In some embodiments, the pixel circuit further includes a second reset module configured to reset the voltage at the first electrode of the light emitting device 2 according to signals at a second reset signal terminal RESET2 and the initialization signal terminal INIT; the second reset module includes:

an eighth transistor T8, a first electrode of the eighth transistor T8 being connected to the first electrode of the light emitting device 2, a second electrode of the eighth transistor T8 being connected to the initialization signal terminal INIT, and a gate of the eighth transistor T8 being connected to the second reset signal terminal RESET2.

As a mode of the embodiment of the present disclosure, the pixel circuit may further include other modules such as the control module, the second reset module, and the like.

In some embodiments, the driving transistor TD, the first transistor T1, the second transistor T2, the third transistor T3, the fourth transistor T4, the fifth transistor T5, the sixth transistor T6, the seventh transistor T7, and the eighth transistor T8 are all P-type transistors;

or, the driving transistor TD, the first transistor T1, the second transistor T2, the third transistor T3, the fourth transistor T4, the fifth transistor T5, the sixth transistor T6, the seventh transistor T7, and the eighth transistor T8 are all N-type transistors.

When the pixel circuit is in the above specific form, for simplicity, each of the transistors may be the N-type transistor or the P-type transistor.

In some embodiments, the constant voltage signal source VDC is any one of the initialization signal terminal INIT, the first power signal terminal VDD, and the second power signal terminal VSS.

When the pixel circuit is in the above specific form, the constant voltage signal source VDC connected to the second electrode of the voltage stabilizing capacitor C1 may be an existing signal source in the pixel circuit, such as the initialization signal terminal INIT (stabilized as an initialization signal Vinit), the first power signal terminal VDD (stabilized as a first power signal Vdd), the second power signal terminal VSS (stabilized as a second power signal Vss), and the like, and will not be described in detail herein.

The driving method and the operation principle of the above pixel circuit are described later.

In a second aspect, with reference to FIGS. 4 to 8, an embodiment of the present disclosure provides a driving method for a pixel circuit, wherein the pixel circuit is any one of the pixel circuits described above, and the driving method for the pixel circuit includes:

causing the storage module to maintain the driving voltage and to provide the driving voltage to the driving module in the light emitting stage.

In the embodiment of the present disclosure, in the light emitting stage, the driving voltage is maintained by the memory module, and the driving voltage is provided to the driving module to drive the light emitting device 2 to emit light.

In the embodiment of the present disclosure, the voltage stabilizing capacitor C1 is added in the pixel circuit, so that the driving voltage in the light emitting stage has better stability, the variation degree of the light emitting brightness of the light emitting device 2 is small, the flicker phenomenon may be improved or avoided, and the display quality is improved.

In a display process, the driving procedure (driving method) for the pixel circuit may be performed repeatedly, wherein each driving procedure includes a plurality of stages.

In some embodiments, the driving method for a pixel circuit includes steps of:

continuously providing an initialization signal to the initialization signal terminal INIT, continuously providing a first power signal to the first power signal terminal VDD, and continuously providing a second power signal to the second power signal terminal VSS;

in a reset stage, providing a turn-on signal to the first reset signal terminal RESET1, providing a turn-off signal to the gate signal terminal GATE, and providing a turn-off signal to the control signal terminal EM;

in a write stage, providing a turn-off signal to the first reset signal terminal RESET1, providing a turn-on signal to the gate signal terminal GATE, providing a turn-off signal to the control signal terminal EM, and providing a data signal to the data signal terminal DATA;

in a light emitting stage, providing a turn-off signal to the first reset signal terminal RESET1, providing a turn-off signal to the gate signal terminal GATE, and providing a turn-on signal to the control signal terminal EM.

In some embodiments, the driving method for a pixel circuit includes steps of:

in the reset stage, providing a turn-off signal to the second reset signal terminal RESET2;

in the write stage, providing a turn-on signal to the second reset signal terminal RESET2;

in the light emitting stage, providing a turn-off signal to the second reset signal terminal RESET2.

In some embodiments, respective signals may be provided to the signal terminals in the above manner during various stages of the driving procedure to drive the pixel circuit.

The signal at the second reset signal terminal RESET2 is always the same as the signal at the gate signal terminal GATE, so the second reset signal terminal RESET2 and the gate signal terminal GATE of the pixel circuit may be connected to the same signal source, for example, to the same pin of a driver IC.

Figure 5:
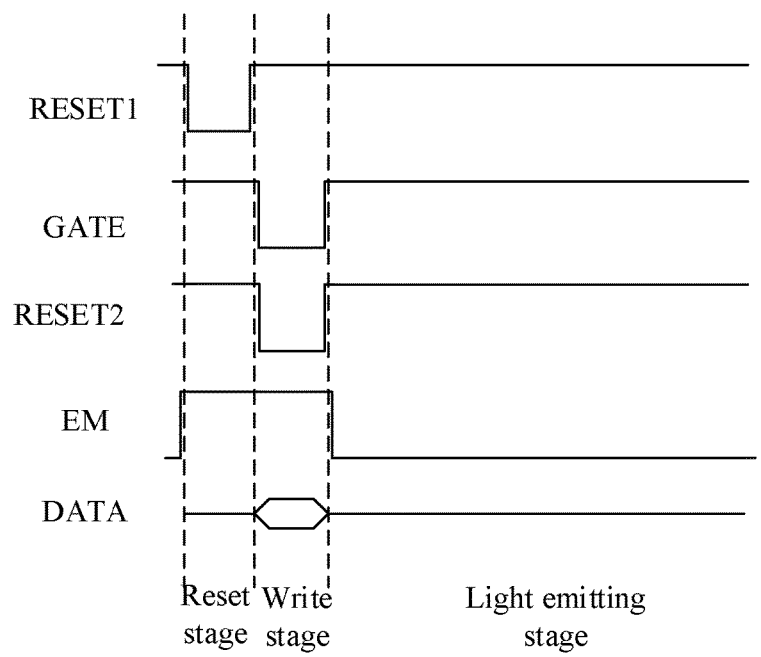
FIG. 5 is a timing diagram of driving signals for a pixel circuit according to an embodiment of the present disclosure.

Referring to FIGS. 4 and 5, as a mode of the embodiment of the present disclosure, the driving method for the pixel circuit according to the embodiment of the present disclosure will be described below by taking as an example in which the driving transistor TD, the first transistor T1, the second transistor T2, the third transistor T3, the fourth transistor T4, the fifth transistor T5, the sixth transistor T6, the seventh transistor T7, and the eighth transistor T8 are all P-type transistors.

In each stage of the driving procedure for the pixel circuit of the embodiment of the present disclosure, the initialization signal Vinit is continuously provided to the initialization signal terminal INIT, the first power signal Vdd is continuously provided to the first power signal terminal VDD, and the second power signal Vss is continuously provided to the second power signal terminal VS S; conditions in which signals are provided to other signal terminals in each stage are as follows:

S101, in the reset stage: a low level signal is provided to the first reset signal terminal RESET1, a high level signal is provided to the gate signal terminal GATE, a high level signal is provided to the control signal terminal EM, and a high level signal is provided to the second reset signal terminal RESET2.

In this stage, the low level signal at the first reset signal terminal RESET1 turns on the first transistor T1 and the third transistor T3, thereby writing the initialization signal Vinit into the first node N1 and the second node N2.

S102, in the write stage, a high level signal is provided to the first reset signal terminal RESET1, a low level signal is provided to the gate signal terminal GATE, a high level signal is provided to the control signal terminal EM, a data signal is provided to the data signal terminal DATA, and a low level signal is provided to the second reset signal terminal RESET2.

In this stage, the low level signal at the gate signal terminal GATE turns on the second transistor T2, the fourth transistor T4 and the fifth transistor T5, so that the data signal Vdata at the data signal terminal DATA is written into the first electrode of the driving transistor TD through the fifth transistor T5; after the data signal Vdata passes through the driving transistor TD, the voltage at the first node N1 (the first electrode of the storage capacitor Cst) is changed to Vdata-Vth, where Vth is a threshold voltage of the driving transistor TD.

The above data signal is a data signal corresponding to this pixel circuit. The data signal terminal DATA actually obtains data signals corresponding to other pixel circuits at other times of the driving procedure (because other pixel circuits may be in the write stage), but the data signals are not written into this pixel circuit because the fifth transistor T5 is turned off at other times.

Since the second reset signal terminal RESET2 is provided with the low level signal, the initialization signal Vinit at the initialization signal terminal INIT is written into the first electrode of the light emitting device 2 through the eighth transistor T8, resetting the voltage at that location.

S103, in the light emitting stage, a high level signal is provided to the first reset signal terminal RESET1, a high level signal is provided to the gate signal terminal GATE, a low level signal is provided to the control signal terminal EM, and a high level signal is provided to the second reset signal terminal RESET2.

In this stage, the control signal terminal EM is provided with the low level signal, so that the sixth transistor T6 and the seventh transistor T7 are both turned on, so that current may flow from the first power signal terminal VDD to the second power signal terminal VSS, and the light emitting device 2 may continuously emit light until the next reset stage (in the next frame) comes.

Due to the maintaining function of the storage capacitor Cst, the voltage (driving voltage) at the gate (first node N1) of the driving transistor TD is maintained at Vdata-Vth in this stage; since the voltage at the first electrode of the driving transistor TD is the first power signal Vdd, the gate-source voltage Vgs thereof is Vdata-Vth. The driving current holed flowing through the driving transistor TD is proportional to a difference between the gate-source voltage Vgs and the threshold voltage Vth, i.e., the driving current holed is proportional to Vdd−(Vdata−Vth)−Vth=Vdd−Vdata. It may be seen that the driving current holed is only related to the data voltage Vdata, and is not related to the threshold voltage Vth of the driving transistor TD, i.e. the influence of the threshold voltage shift is eliminated.

In the embodiment of the present disclosure, in the light emitting stage, the second node N2 should theoretically maintain the initialization signal Vinit, the voltage of the initialization signal Vinit is usually lower than the voltage Vdata-Vth at the first node N1, so the second node N2 will "pull down" the voltage at the first node N1 due to the leakage current of the first transistor T1; since the voltage at the third node N3 is higher than the voltage at the first node N1, the third node N3 will "pull up" the voltage at the first node N1 due to the leakage current of the second transistor T2, and the pulling up capability of the third node N3 is usually stronger than the pulling down capability of the second node N2, so that the voltage at the first node N1 gradually increases, and the brightness of the light emitting device 2 gradually decreases in the light emitting stage.

In the embodiment of the present disclosure, because the voltage stabilizing capacitor C1 is provided, the voltage at the second node N2 is more stable and may be maintained at a "lower" level, so that the capability of "pulling down" the first node N1 by the second node N2 is stronger, so that the voltage at the first node N1 is more stable, and the brightness of the light emitting device 2 is also more stable in the light emitting stage.

Specifically, when entering the write stage, the signal at the first reset signal terminal RESET1 "jumps" from the low level signal to the high level signal, so that the first transistor T1 and the third transistor T3 are turned off. It may be seen that the first reset signal terminal RESET1 connects the gates of the first transistor T1 and the third transistor T3, and the second node N2 is the second electrode of the first transistor T1 and the first electrode of the third transistor T3, so the second node N2 is usually very close to the first reset signal terminal RESET1. Therefore, the "jumping" of the signal at the first reset signal terminal RESET1 also increases the voltage at the second node N2 through the coupling effect, so that the initial voltage at the second node N2 is substantially higher than the voltage of the initialization signal Vinit at the beginning of the light emitting stage.

In the embodiment of the present disclosure, since the voltage stabilizing capacitor C1 is provided, the influence of the "jumping" of the signal at the first reset signal terminal RESET1 on the voltage at the second node N2 is weakened, and the initial voltage at the second node N2 is at a lower level at the beginning of the light emitting stage, which may enhance the capability of "pulling down" the voltage at the first node N1 by the second node N2, thereby improving the display quality.

Figure 8:
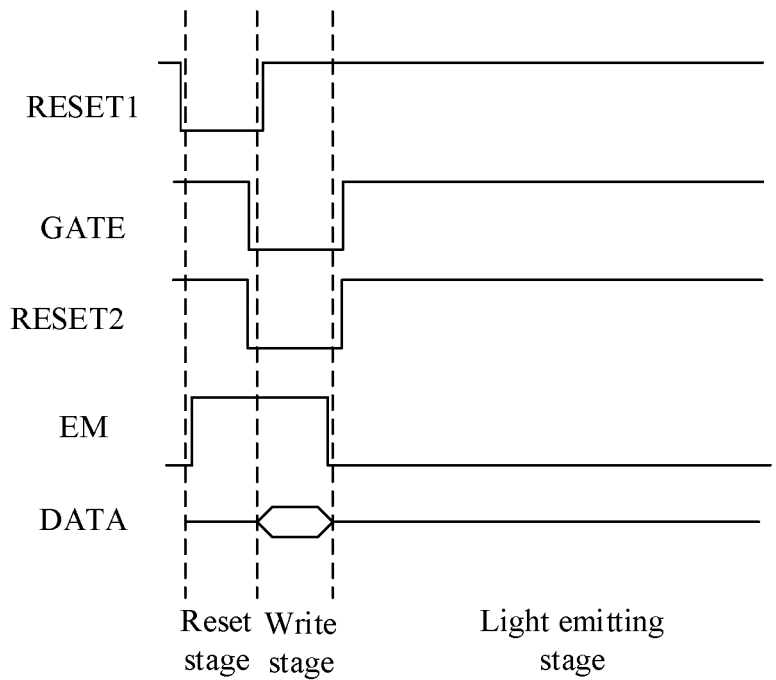
FIG. 8 is a timing diagram of driving signals for a pixel circuit according to an embodiment of the present disclosure.

Referring to FIGS. 7 and 8, as another mode of the embodiment of the present disclosure, the driving method for the pixel circuit according to the embodiment of the present disclosure will be described below by taking as an example in which the driving transistor TD, the first transistor T1, the second transistor T2, the third transistor T3, the fourth transistor T4, the fifth transistor T5, the sixth transistor T6, the seventh transistor T7, and the eighth transistor T8 are all N-type transistors.

In each stage of the driving procedure for the pixel circuit of the embodiment of the present disclosure, the initialization signal Vinit is continuously provided to the initialization signal terminal INIT, the first power signal Vdd is continuously provided to the first power signal terminal VDD, and the second power signal Vss is continuously provided to the second power signal terminal VSS; conditions in which signals are provided to other signal terminals in each stage are as follows:

S201, in the reset stage: a high level signal is provided to the first reset signal terminal RESET1, a low level signal is provided to the gate signal terminal GATE, a low level signal is provided to the control signal terminal EM, and a low level signal is provided to the second reset signal terminal RESET2.

In this stage, the high level signal at the first reset signal terminal RESET1 turns on the first transistor T1 and the third transistor T3, thereby writing the initialization signal Vinit into the first node N1 and the second node N2.

S202, in the write stage, a low level signal is provided to the first reset signal terminal RESET1, a high level signal is provided to the gate signal terminal GATE, a low level signal is provided to the control signal terminal EM, a data signal is provided to the data signal terminal DATA, and a high level signal is provided to the second reset signal terminal RESET2.

In this stage, the high level signal at the gate signal terminal GATE turns on the second transistor T2, the fourth transistor T4 and the fifth transistor T5, so that the data signal Vdata at the data signal terminal DATA is written into the first electrode of the driving transistor TD through the fifth transistor T5; after the data signal Vdata passes through the driving transistor TD, the voltage at the first node N1 (the first electrode of the storage capacitor Cst) is changed to Vdata-Vth, where Vth is a threshold voltage of the driving transistor TD.

The above data signal is data signal corresponding to this pixel circuit. The data signal terminal DATA actually obtains data signals corresponding to other pixel circuits at other times of the driving procedure (because other pixel circuits may be in the write stage), but the data signals are not written into this pixel circuit because the fifth transistor T5 is turned off at other times.

Since the second reset signal terminal RESET2 is provided with the high level signal, the initialization signal Vinit at the initialization signal terminal INIT is written into the first electrode of the light emitting device 2 through the eighth transistor T8, resetting the voltage at that location.

S203, in the light emitting stage, a low level signal is provided to the first reset signal terminal RESET1, a low level signal is provided to the gate signal terminal GATE, a high level signal is provided to the control signal terminal EM, and a low level signal is provided to the second reset signal terminal RESET2.

In this stage, the control signal terminal EM is provided with the high level signal, so that the sixth transistor T6 and the seventh transistor T7 are both turned on, so that current may flow from the first power signal terminal VDD to the second power signal terminal VSS, and the light emitting device 2 may continuously emit light until the next reset stage (in the next frame) comes.

Due to the maintaining function of the storage capacitor Cst, the voltage (driving voltage) at the gate (first node N1) of the driving transistor TD is maintained at Vdata-Vth in this stage; since the voltage at the first electrode of the driving transistor TD is the first power signal Vdd, the gate-source voltage Vgs thereof is Vdata-Vth. The driving current holed flowing through the driving transistor TD is proportional to a difference between the gate-source voltage Vgs and the threshold voltage Vth, i.e., the driving current holed is proportional to Vdd−(Vdata−Vth)−Vth=Vdd−Vdata. It may be seen that the driving current holed is only related to the data voltage Vdata, and is not related to the threshold voltage Vth of the driving transistor TD, i.e. the influence of the threshold voltage shift is eliminated.

It may be seen that when different types (N-type and P-type) of transistors are used, only the levels of the turn-on signals and the turn-off signals are interchanged, and the specific driving procedure and principle of the pixel circuit of the embodiment of the present disclosure are not changed, and thus, will not be described in detail herein.

In a third aspect, referring to FIGS. 4 to 21, an embodiment of the present disclosure provides a display substrate, including:

a base plate;

a plurality of sub-pixels on the base plate, at least some of the sub-pixels including any pixel circuit described above.

The base plate is a base for supporting other structures on the display substrate, and is a substantially sheet-shaped structure made of glass, silicon (such as monocrystalline silicon), polymer material (such as polyimide), and the like, and may be rigid or flexible, and may have a thickness in a millimeter order.

The sub-pixel refers to the smallest structure that may be used to independently display desired content, i.e., the smallest "dot" in a display device that may be individually controlled. Different sub-pixels may have different colors, so that color display may be realized by mixing light from different sub-pixels: for example, a plurality of sub-pixels of different colors arranged together may form one "pixel (or pixel unit)", that is, the light emitted by these sub-pixels is mixed together to form one "dot" visually. For example, three sub-pixels of three colors of red, green and blue form one pixel. Alternatively, instead of having distinct pixels (or pixel units), color display may be realized by "sharing" between adjacent sub-pixels.

In the embodiment of the present disclosure, the above components of the pixel circuit may be disposed on the base plate, and each pixel circuit corresponds to one sub-pixel. That is, light emitted from the light emitting device 2 in the pixel circuit is used as light emitted from the sub-pixel.

In the pixel circuit corresponding to the sub-pixels with different colors, the light emitting devices 2 may directly emit light with different colors, or the light emitting devices 2 may both emit white light, which passes through color filters (CF) with different colors, forming light with different colors.

The pixel circuit is used, so that the display substrate of the embodiment of the present disclosure has the advantages of stable brightness, no flicker phenomenon and good display quality when displaying.

In some embodiments, the sub-pixels may be arranged in an array on the display substrate, and the pixel circuit in each sub-pixel is provided with signals through a plurality of signal lines to control the sub-pixels to display.

The signal lines may include a plurality of gate signal lines extending along a first direction (e.g., a row direction), a plurality of first reset signal lines extending along the first direction, a plurality of second reset signal lines extending along the first direction, a plurality of control signal lines extending along the first direction, and a plurality of initialization signal lines extending along the first direction; each gate signal line is connected to the gate signal terminal GATE of the pixel circuit of each sub-pixel in a row, each first reset signal line is connected to the first reset signal terminal RESET1 of the pixel circuit of each sub-pixel in a row, each second reset signal line is connected to the second reset signal terminal RESET2 of the pixel circuit of each sub-pixel in a row (and the second reset signal line may be connected to a same signal source as the gate signal line corresponding to the sub-pixel in the row), each control signal line is connected to the control signal terminal EM of the pixel circuit of each sub-pixel in a row, and each initialization signal line is connected to the initialization signal terminal INIT of the pixel circuit of each sub-pixel in a row.

The signal lines may further include a plurality of data lines extending in a second direction (e.g., a column direction); each data line is connected to the data signal terminal DATA of the pixel circuit of each sub-pixel in a row.

The signal lines may further include a first power signal line, a second power signal line, the initialization signal line, and the like, which may extend in the row direction or the column direction, may be formed as having a grid shape, and are respectively connected to the first power signal terminal VDD, the second power signal terminal VSS, and the initialization signal terminal INIT of the pixel circuit of each sub-pixel.

In some embodiments, the capacitance of the voltage stabilizing capacitor C1 is not less than 8 fF (femtoFaraday) and not more than one-fourth of the capacitance of the storage capacitor Cst.

If the capacitance of the voltage stabilizing capacitor C1 is too small, it will not achieve a sufficient voltage stabilizing effect. It has been found that the capacitance of the voltage stabilizing capacitor C1 should be at least 8 fF, for example, 8 fF, 10 fF, 12 fF, etc.

As shown in FIG. 6, when the capacitances of the voltage stabilizing capacitor C1 are different, the resistance capability to the voltage variation at the first node N1 is different. The larger the capacitance of the voltage stabilizing capacitor C1 is, the stronger the resistance capability to the voltage variation at the first node N1 is.

Figure 9:
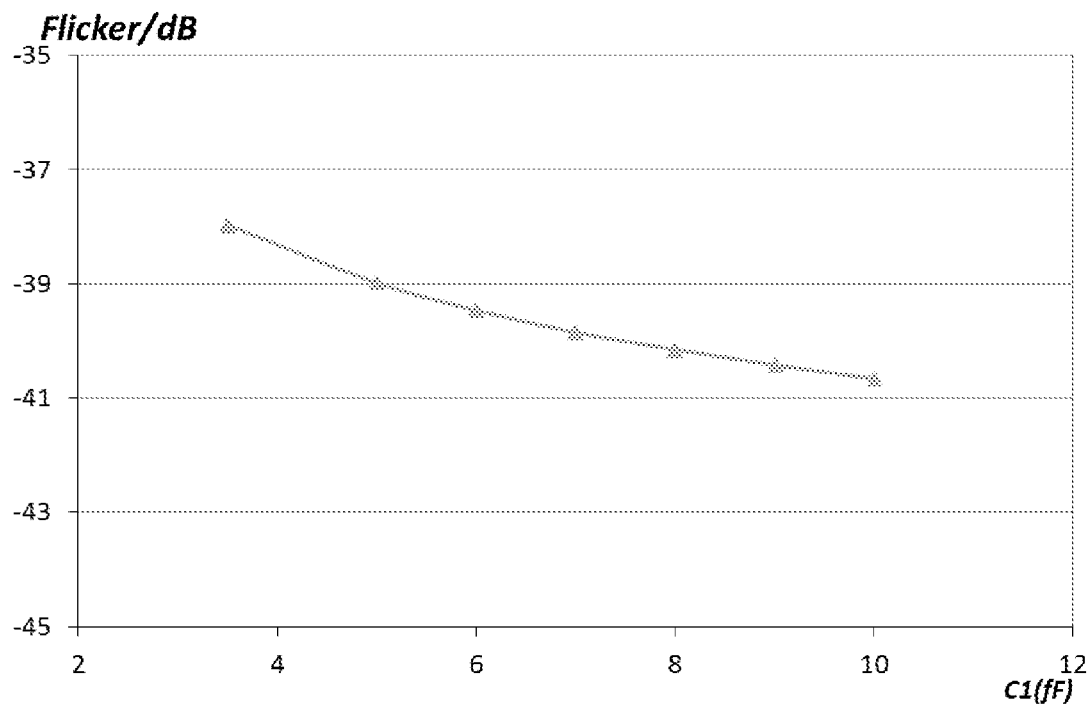
FIG. 9 is a diagram showing a simulation result of a Flicker value varying over a capacitance value of a voltage stabilizing capacitor in a pixel circuit according to an embodiment of the present disclosure.

Further, when the capacitances of the voltage stabilizing capacitor C1 are different, a Flicker value obtained by simulation is shown in FIG. 9. The Flicker value is a dimensionless numerical value calculated according to a curve of luminance over time in the light emitting stage, and is used for representing the flicker degree of display. The lower the Flicker value is, the smaller the flicker degree is, that is, the more stable the luminance is, the better the display quality is.

The capacitance of the voltage stabilizing capacitor C1 cannot be too high, otherwise the "pulling down" capability of the second node N2 is stronger than the "pulling up" capability of the third node N3, which causes the voltage at the first node N1 to change (decrease) in a "reverse direction" in the light emitting stage, and also causes the brightness instability. Therefore, the capacitance of the voltage stabilizing capacitor C1 generally cannot exceed ¼ of the capacitance of the storage capacitor Cst, and may be around ⅕ of the capacitance of the storage capacitor Cst.

In some embodiments, the first electrode of the voltage stabilizing capacitor C1 and the second electrode of the first transistor T1 are disposed in a same layer and are connected as a whole.

Figure 10:
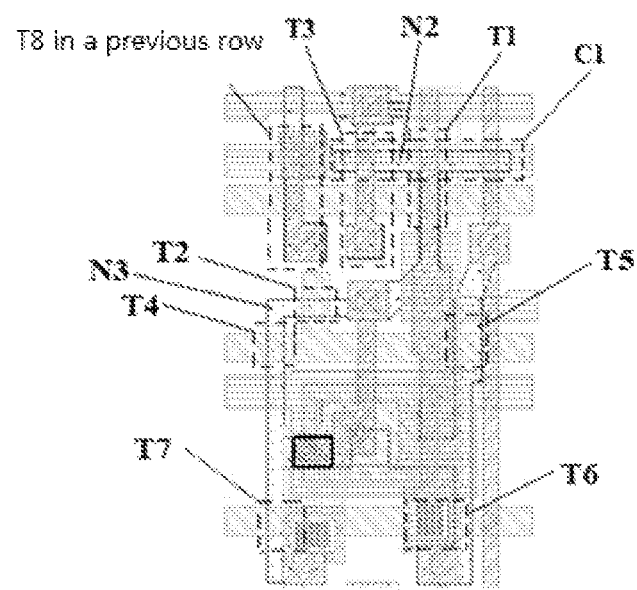
FIG. 10 is a schematic perspective diagram of a structure of a part of a pixel circuit in a display substrate according to an embodiment of the present disclosure.
Figure 11:
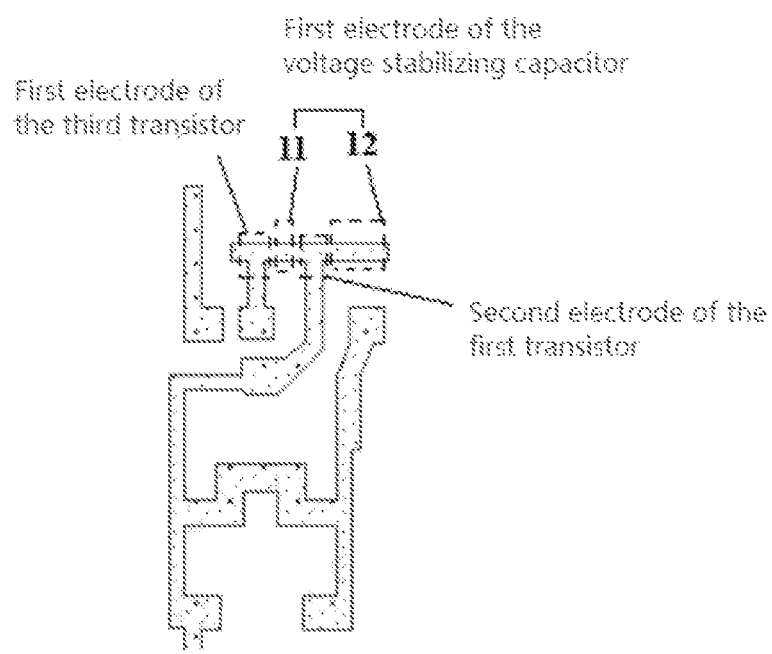
FIG. 11 is a schematic diagram of a structure of a POLY layer of a pixel circuit in a display substrate according to an embodiment of the present disclosure.

Respective structures of the pixel circuit disposed on the base plate may be disposed in different layers, and since the first electrode of the voltage stabilizing capacitor C1 needs to be connected to the second electrode of the first transistor T1, referring to FIGS. 10 and 11, as a mode of the embodiment of the present disclosure, the first electrode of the voltage stabilizing capacitor C1 and the second electrode of the first transistor T1 are disposed in a same layer and are unitary structure, so as to simplify the structure and the manufacturing method of the display substrate.

When the first electrode of the third transistor T3 is also connected to the first electrode of the voltage stabilizing capacitor C1, referring to FIGS. 10 and 11, the first electrode of the voltage stabilizing capacitor C1, the second electrode of the first transistor T1, and the first electrode of the third transistor T3 may be unitary structure.

In some embodiments, the first electrode of the voltage stabilizing capacitor C1 is disposed in a same layer as an active region of the driving transistor TD, and the first electrode of the voltage stabilizing capacitor C1 is made of a conductorized semiconductor material;

The second electrode of the first transistor T1 is disposed in a same layer as the active region of the driving transistor TD, and the second electrode of the first transistor T1 is made of a conductorized semiconductor material.

Referring to FIGS. 10 and 11, in order to further simplify the structure, the first electrode of the voltage stabilizing capacitor C1, the second electrode of the first transistor T1 (and optionally, the first electrode of the third transistor T3) may be unitary structure, may be connected with an active region of the first transistor T1 (and optionally, an active region of the third transistor T3) as a whole. That is, these structures are all made of semiconductor material (e.g., polysilicon material), but the portion corresponding to the first electrode of the voltage stabilizing capacitor C1, the second electrode of the first transistor T1, and the first electrode of the third transistor T3 need to be formed into conductors through a conductorization processing.

Alternatively, it is also possible that structures, such as the first electrode of the first transistor T1, the second electrode of the third transistor T3, etc., are connected with the above structures as a whole.

Alternatively, it is also possible that the first electrode of the voltage stabilizing capacitor C1, the second electrode of the first transistor T1, the first electrode of the third transistor T3, the active region of the first transistor T1, the active region of the third transistor T3, and the like are respectively disposed in different layers and are connected with each other through vias in an insulating layer and the like.

In some embodiments, the first electrode of the voltage stabilizing capacitor C1 includes: a connection portion 11 connected between the first electrode of the third transistor T3 and the second electrode of the first transistor T1; and an additional portion 12 connected to the connection portion 11.

Obviously, the first electrode of the third transistor T3 and the second electrode of the first transistor T1 should be connected to each other to form a "dual-gate transistor", so that referring to FIGS. 10 and 11, a connection structure (connection portion 11) between the first electrode of the third transistor T3 and the second electrode of the first transistor T1 is directly used as the first electrode of the voltage stabilizing capacitor C1. That is, the first electrode of the third transistor T3 and the second electrode of the first transistor T1 are connected to each other through the first electrode of the voltage stabilizing capacitor C1.

Referring to FIGS. 10 and 11, an area of the structure (connection portion 11) through which the first electrode of the third transistor T3 is directly connected to the second electrode of the first transistor T1 is relatively small, so that the capacitance of the voltage stabilizing capacitor C1 is small and therefore, the voltage stabilizing effect is not good enough if only the connection portion 11 is used as the first electrode of the voltage stabilizing capacitor C1. For this reason, the first electrode of the voltage stabilizing capacitor C1 may include an extra portion (additional portion 12) "extending" from the connection portion 11 in addition to the connection portion 11, and the additional portion 12 may increase the capacitance of the voltage stabilizing capacitor C1 although the additional portion 12 does not directly have a connection function.

In some embodiments, the second electrode of the voltage stabilizing capacitor C1 and the initialization signal terminal INIT disposed in a same layer and connected as a whole.

Obviously, the second electrode of the voltage stabilizing capacitor C1 should be overlapped and insulated with the first electrode of the voltage stabilizing capacitor C1. That is, orthographic projections of the first electrode and the second electrode of the voltage stabilizing capacitor C1 on the base plate should be overlapped with each other, and the first electrode and the second electrode of the voltage stabilizing capacitor C1 are separated by at least one insulating layer.

Figure 13:
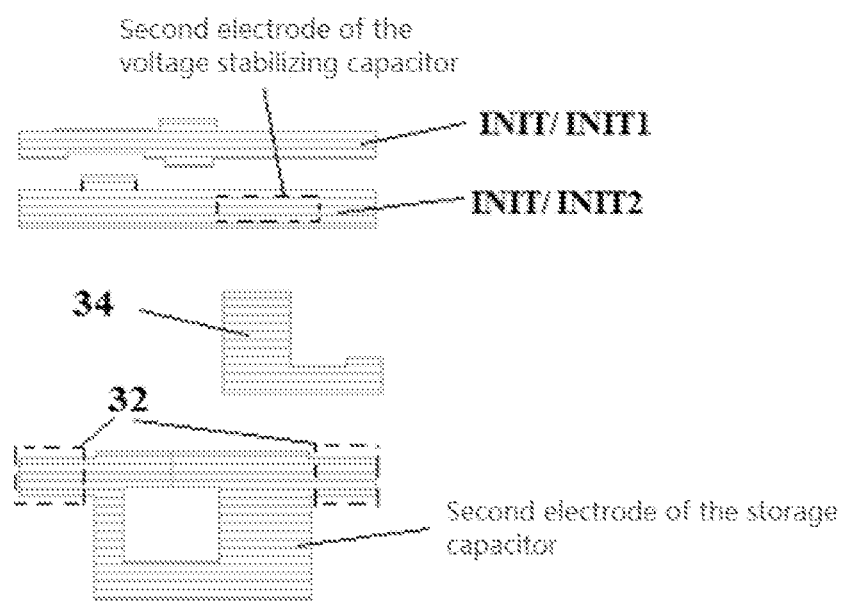
FIG. 13 is a schematic diagram of a structure of a second gate layer of a pixel circuit in a display substrate according to an embodiment of the present disclosure.
Figure 14:
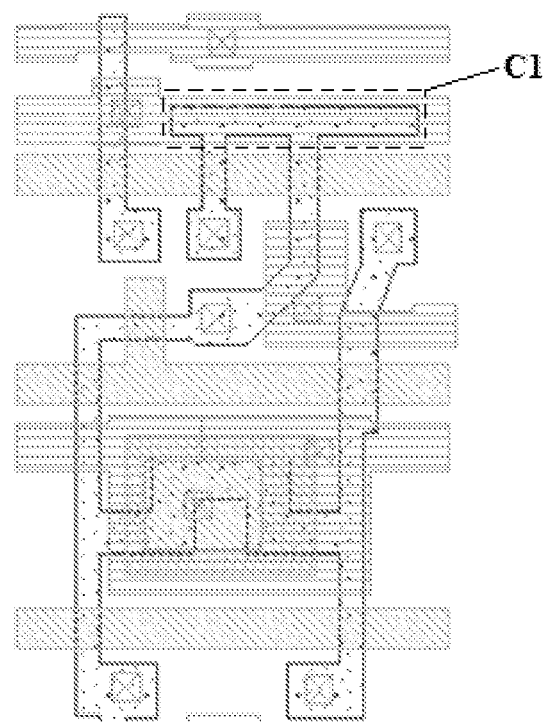
FIG. 14 is a schematic perspective diagram of a structure of a voltage stabilizing capacitor in a pixel circuit in a display substrate according to an embodiment of the present disclosure.

For this reason, as a mode of the embodiment of the present disclosure, referring to FIGS. 10, 13, and 14, a structure disposed in a same layer as the initialization signal terminal INIT may be used as the second electrode of the voltage stabilizing capacitor C1, and the second electrode of the voltage stabilizing capacitor C1 is directly connected to the initialization signal terminal INIT.

In some embodiments, with reference to FIG. 13, the second electrode of the voltage stabilizing capacitor C1 may be located within the initialization signal terminal INIT. That is, a portion of the initialization signal terminal INIT is also the second electrode of the voltage stabilizing capacitor C1. In other words, the initialization signal terminal INIT may be caused to directly cover on the position where the first electrode of the voltage stabilizing capacitor C1 is located.

In some embodiments, in a direction gradually distal to the base plate, the display substrate sequentially includes:

the active region of the driving transistor TD and the first electrode of the voltage stabilizing capacitor C1;

a gate insulating layer (GI);

the gate of the driving transistor TD;

a first interlayer insulating layer (ILD1);

the second electrode of the voltage stabilizing capacitor C1 and the initialization signal terminal INIT.

The layer (such as GATE2 layer) where the initialization signal terminal INIT is located is closer to the layer (POLY) where the active region of the transistor is located (the number of insulating layers therebetween is less), so that such two layers are respectively used as the layers where two electrodes of the voltage stabilizing capacitor C1 are located, such that a distance between the two electrodes of the voltage stabilizing capacitor C1 may be reduced, and the capacitance of the voltage stabilizing capacitor C1 may be improved. Further, the second electrode of the voltage stabilizing capacitor C1 and the initialization signal terminal INIT are disposed in a same layer and are connected as a whole, so that the initialization signal terminal INIT may be conveniently used as the constant voltage signal source VDC.

On the other hand, the layers (for example, SD1 layer) farther from the base plate than the initialization signal terminal INIT are farther away from the layer where the active region of the transistor is located. These layers are used as the second electrode of the voltage stabilizing capacitor C1, which would easily cause the capacitance of the voltage stabilizing capacitor C1 to decrease. Although the layer (for example, GATE1 layer) where the gate signal terminal GATE is located is relatively close to the layer where the active region of the transistor is located, the signal at the gate signal terminal GATE is changed, so if the structure in the layer where the gate signal terminal GATE is located is used as the second electrode of the voltage stabilizing capacitor C1, it is necessary to separately introduce a constant voltage signal into the structure from other layers, which is troublesome.

Alternatively, it is also possible to use a structure disposed in a same layer as other structures (e.g., the first power signal terminal VDD, the second power signal terminal VSS, etc.) as the second electrode of the voltage stabilizing capacitor C1.

In some embodiments, the initialization signal terminal INIT includes a first initialization signal terminal INIT1 and a second initialization signal terminal INIT2 in a same layer and parallel to and separated from each other;

the second electrode of the eighth transistor T8 is connected to the first initialization signal terminal INIT1;

the second electrode of the third transistor T3 is connected to the second initialization signal terminal INIT2.

Referring to FIG. 13, the initialization signal terminal INIT may be divided into two structures (the first initialization signal terminal INIT1 and the second initialization signal terminal INIT 2) disposed in the same layer but independent of each other and respectively connected to the second electrode of the third transistor T3 and the second electrode of the eighth transistor T8, so that the signals at the second electrode of the third transistor T3 and the second electrode of the eighth transistor T8 may be the same or different, as necessary, to implement more complex control.

Alternatively, it is also possible that the initialization signal terminal INIT connected to the second electrode of the third transistor T3 and the second electrode of the eighth transistor T8 is a unitary structure (i.e., not including the first initialization signal terminal INIT1 and the second initialization signal terminal INIT2).

In some embodiments, the first electrode of the voltage stabilizing capacitor C1 extends in the first direction;

the data signal terminal DATA and/or the first power signal terminal VDD extend in a second direction; the first direction intersects the second direction.

Figure 15:
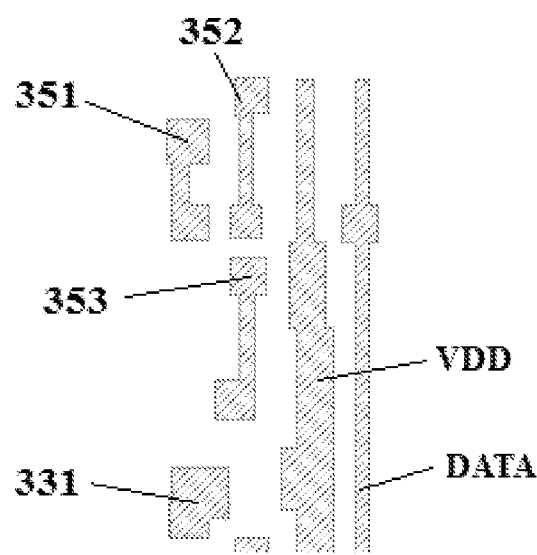
FIG. 15 is a schematic diagram of a structure of a first source-drain layer of a pixel circuit in a display substrate according to an embodiment of the present disclosure.

Referring to FIG. 11, the first electrode of the voltage stabilizing capacitor C1 may extend in the first direction (a lateral direction in FIG. 11) as a whole. Referring to FIG. 15, the data signal terminal DATA and the first power signal terminal VDD may extend in the second direction (a longitudinal direction in FIG. 15) intersecting (which may be further perpendicular to) the first direction. Thus, referring to FIG. 10, the first electrode of the voltage stabilizing capacitor C1 may overlap with (of course, be insulated from) the data signal terminal DATA and the first power signal terminal VDD.

In some embodiments, the first reset signal terminal RESET1 extends in the first direction;

the first reset signal terminal RESET1 of at least a part of pixel circuits is also used as a second reset signal terminal RESET2 of a pixel circuit adjacent to the pixel circuit along the second direction; the first direction intersects the second direction.

Referring to FIGS. 5 and 8, a difference between the signal at the first reset signal terminal RESET1 and the signal at the second reset signal terminal RESET2 is one cycle. Thus, in the pixel circuits adjacent to each other in the second direction (e.g., the longitudinal direction in FIG. 12), a signal at a second reset signal terminal RESET2 of a pixel circuit of a previous row is the same as that of a first reset signal terminal RESET1 of a pixel circuit in a present row.

Figure 12:
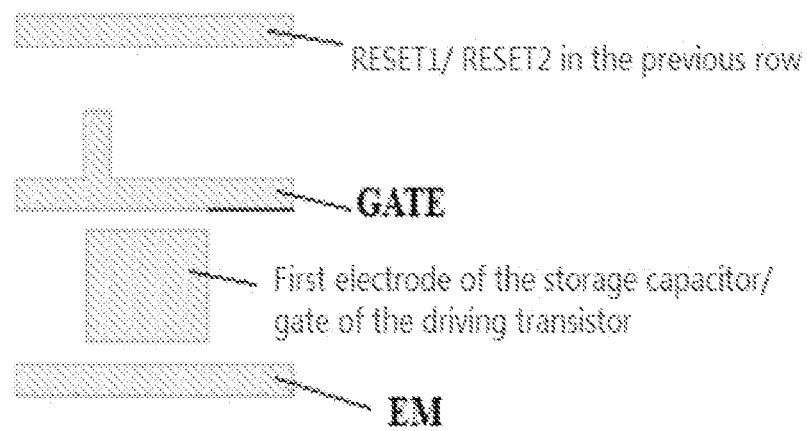
FIG. 12 is a schematic diagram of a structure of a first gate layer of a pixel circuit in a display substrate according to an embodiment of the present disclosure.

Thus, referring to FIG. 12, in order to simplify the structure, the first reset signal terminal RESET1 of each pixel circuit may be extended in the first direction (the lateral direction in FIG. 12) while it is multiplexed as the second reset signal terminals RESET2 of the pixel circuit adjacent to the pixel circuit in the second direction (the longitudinal direction in FIG. 12). That is, referring to FIG. 10, the eighth transistor T8 of the pixel circuit in the previous row may be located in a rectangular area with other structures of the pixel circuit in the row, so as to use the first reset signal terminal RESET1 of the pixel circuit in the present row (i.e., the second reset signal terminal RESET2 of the pixel circuit in the previous row) as the gate of the eighth transistor T8.

In some embodiments, the second electrode of the storage capacitor Cst includes a lateral connection structure 32 extending in the first direction; the lateral connection structures 32 of the adjacent pixel circuits at least partially in the first direction are connected to each other;

the first power signal terminal VDD extends along the second direction; the first direction intersects the second direction.

Referring to FIG. 13, the second electrode of the storage capacitor Cst has the lateral connection structure 32 extending in the first direction (in the lateral direction in FIG. 13) in addition to a structure (a rectangle structure with a notch in FIG. 13) overlapping the first electrode of the storage capacitor Cst, so that the plurality of storage capacitors Cst in the same row may be connected as a whole through the lateral connection structure 32.

Meanwhile, referring to FIG. 15, the first power signal terminal VDD extends in the second direction (the longitudinal direction in FIG. 15) intersecting the first direction, and the first power signal terminal VDD is necessarily connected to the storage capacitors Cst in the respective pixel circuits.

Therefore, it may be seen that the first power signal terminals VDD in a plurality of columns are actually electrically connected to the second electrodes of the storage capacitors Cst in the same row. That is, electrically, the structure for providing the first power signal Vdd forms a grid shape, so as to reduce the power supply resistance thereof.

In some embodiments, the display substrate further includes:

an auxiliary conductive structure 31 disposed to overlap the first power signal terminal VDD; at least one insulating layer is disposed between the auxiliary conductive structure 31 and the first power signal terminal VDD, and the auxiliary conductive structure 31 is connected to the first power signal terminal VDD through a via in the insulating layer.

Figure 16:
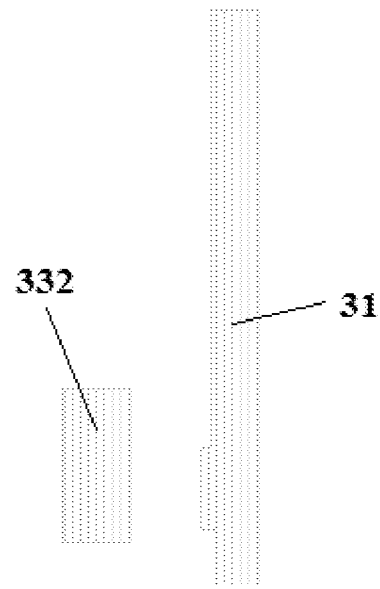
FIG. 16 is a schematic diagram of a structure of a second source-drain layer of a pixel circuit in a display substrate according to an embodiment of the present disclosure.

Referring to FIG. 16, the auxiliary conductive structure 31 overlapping the first power signal terminal VDD (e.g., and extending along the second direction) may be further included in the display substrate, and the auxiliary conductive structure 31 is connected to the first power signal terminal VDD to further reduce the power supply resistance of the first power signal VDD.

Specific layers of the structure of the pixel circuit will be exemplarily described below by taking the pixel circuit as an example.

In some embodiments, in a direction gradually distal to the base plate, the display substrate sequentially includes:

(1) A semiconductor layer (POLY).

The semiconductor layer is made of a semiconductor material, for example, a polysilicon material (poly-Si).

The semiconductor layer includes: the first electrode, the second electrode, and the active region of the driving transistor TD; the first electrode, the second electrode, and the active region of the first transistor T1; the first electrode, the second electrode, and the active region of the second transistor T2; the first electrode, the second electrode, and the active region of the third transistor T3; the first electrode, the second electrode, and the active region of the fourth transistor T4; the first electrode, the second electrode, and the active region of the fifth transistor T5; the first electrode, the second electrode, and the active region of the sixth transistor T6; the first electrode, the second electrode, and the active region of the seventh transistor T7; the first electrode, the second electrode, and the active region of the eighth transistor T8; and the first electrode of the voltage stabilizing capacitor C1.

The first electrode of the voltage stabilizing capacitor C1 and the second electrode of the first transistor T1 are connected as a single piece, and are made of a conductorized semiconductor material.

That is, referring to FIG. 11, the active region, the first electrode, and the second electrode of each transistor may be located in the semiconductor layer; and the first electrode (the connection portion 11 and the additional portion 12) of the voltage stabilizing capacitor C1 and the second electrode of the first transistor T1 are connected as a single piece and are also located in the semiconductor layer.

Alternatively, the electrodes of all the transistors and the first electrode of the voltage stabilizing capacitor C1 are made of a conductorized semiconductor material.

(2) A gate insulating layer (GI).

The gate insulating layer is made of an insulating material, such as silicon nitride, silicon oxide, or silicon oxynitride, and is used for separating active regions from gates of transistors.

In this case, the active region of each transistor is closer to the base plate than the gate thereof, so that each transistor is a "bottom gate transistor".

Figure 17:
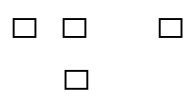
FIG. 17 is a schematic diagram illustrating a distribution of vias in a gate insulating layer of a pixel circuit in a display substrate according to an embodiment of the present disclosure.

Referring to FIG. 17, the gate insulating layer may include: a via through which the first power signal terminal VDD and the first electrode of the sixth transistor T6 are connected to each other, a via through which the data signal terminal DATA and the second electrode of the fifth transistor T5 are connected to each other, a via through which a first light emitting access structure 331 and the second electrode of the seventh transistor T7 are connected to each other, a via through which a first connection structure 351 and the second electrode of the eighth transistor T8 are connected to each other, a via through which a second connection structure 352 and the second electrode of the third transistor T3 are connected to each other, and a via through which a third connection structure 353 and the first electrode of the first transistor T1 are connected to each other (which will be detailed described below).

(3) A first gate layer (GATE1).

The first gate layer is made of a conductive material, for example a metal material.

The first gate layer includes: the gate of the driving transistor TD, the gate of the first transistor T1, the gate of the second transistor T2, the gate of the third transistor T3, the gate of the fourth transistor T4, the gate of the fifth transistor T5, the gate of the sixth transistor T6, the gate of the seventh transistor T7, the gate of the eighth transistor T8, the first reset signal terminal RESET1, the second reset signal terminal RESET2, the control signal terminal EM, and the first electrode of the storage capacitor Cst.

That is, referring to FIG. 12, gates of all transistors, and respective signal terminals for providing signals to the gates may be located in the first gate layer.

In addition, the first electrode of the storage capacitor Cst is also located in the first gate layer since it is inevitably the gate of the driving transistor TD (for example, they are unitary structure).

As before, the first reset signal terminal RESET1 of the pixel circuit in the present row may also be multiplexed as the second reset signal terminal RESET2 of the pixel circuit in the previous row, i.e., each pixel circuit has only one reset signal terminal.

(4) A first interlayer insulating layer (ILD1).

The first interlayer insulating layer is made of an insulating material, such as silicon nitride, silicon oxide, silicon oxynitride, or the like, and is used to separate a structure of the first gate layer from a structure of a subsequent second gate layer.

Referring to FIG. 18, the first interlayer insulating layer may include: a via through which the first power signal terminal VDD and the first electrode of the sixth transistor T6 are connected to each other, a via through which the data signal terminal DATA and the second electrode of the fifth transistor T5 are connected to each other, a via through which the first light emitting access structure 331 and the second electrode of the seventh transistor T7 are connected to each other, a via through which the first connection structure 351 and the second electrode of the eighth transistor T8 are connected to each other, a via through which the second connection structure 352 and the second electrode of the third transistor T3 are connected to each other, a via through which the third connection structure 353 and the gate of the driving transistor TD are connected to each other, and a via through which the third connection structure 353 and the first electrode of the first transistor T1 are connected to each other (which will be detailed descripted below).

(5) A second gate layer (GATE2).

The second gate layer is made of a conductive material, for example a metal material.

The second gate layer includes: the initialization signal terminal INIT, the second electrode of the voltage stabilizing capacitor C1, and the second electrode of the storage capacitor Cst.

The second electrode of the voltage stabilizing capacitor C1 and the initialization signal terminal INIT are connected as a whole.

Referring to FIG. 13, the initialization signal terminal INIT, the second electrode of the voltage stabilizing capacitor C1, and the second electrode of the storage capacitor Cst may be disposed in the second gate layer, and the second electrode of the voltage stabilizing capacitor C1 and the initialization signal terminal INIT are connected as a whole.

Referring to FIG. 13, the initialization signal terminal INIT may include the first initialization signal terminal INIT1 and the second initialization signal terminal INIT2, and the second electrode of the voltage stabilizing capacitor C1 may have a unitary structure with one of the first initialization signal terminal INIT1 and the second initialization signal terminal INIT2. For example, the second electrode of the voltage stabilizing capacitor C1 may have a unitary structure with the second initialization signal terminal INIT2.

Referring to FIG. 13, the second electrode of the storage capacitor Cst may also include the above lateral connection structure 32.

Referring to FIG. 13, except for the lateral connection structure 32, the second electrode of the storage capacitor Cst may include a rectangle structure with a notch, and the notch is used such that the first electrode of the storage capacitor Cst located below the notch may be connected to the first electrode of the first transistor T1 (which will be detailed descripted below).

In some embodiments, the second gate layer further includes: a shielding structure 34, wherein the shielding structure 34 is connected to the first power signal terminal VDD through a via in the second interlayer insulating layer, and the shielding structure 34 overlaps and is insulated from the first electrode of the first transistor T1 and the second electrode of the fifth transistor T5.

Referring to FIG. 13, the shielding structure 34 may also be disposed in the second gate layer. Referring to FIGS. 10 and 15, the shielding structure 34 is connected to the first power signal terminal VDD (which will be detailed descripted below) and overlaps the first electrode of the first transistor T1 and the second electrode of the fifth transistor T5, to shield the influence of other signals (such as the signal at the data signal terminal DATA) on the first transistor T1 and the fifth transistor T5.

(6) A second interlayer insulating layer (ILD2).

The second interlayer insulating layer is made of an insulating material, such as silicon nitride, silicon oxide, silicon oxynitride, or the like, and is used for separating the structure of the second gate layer from the structure of the subsequent first source-drain layer.

Referring to FIG. 19, the second interlayer insulating layer may include: a via through which the first power signal terminal VDD and the second electrode of the storage capacitor Cst are connected to each other, a via through which the first power signal terminal VDD and the first electrode of the sixth transistor T6 are connected to each other, a via through which the data signal terminal DATA and the second electrode of the fifth transistor T5 are connected to each other, a via through which the first light emitting access structure 331 and the second electrode of the seventh transistor T7 are connected to each other, a via through which the first connection structure 351 and the second electrode of the eighth transistor T8 are connected to each other, a via through which the first connection structure 351 and the initialization signal terminal INIT are connected to each other, a via through which the second connection structure 352 and the second electrode of the third transistor T3 are connected to each other, a via through which the second connection structure 352 and the initialization signal terminal INIT are connected to each other, a via through which the third connection structure 353 and the gate of the driving transistor TD are connected to each other, a via through which the third connection structure 353 and the first electrode of the first transistor T1 are connected to each other, a via through which the first power signal terminal VDD and the shielding structure 34 are connected to each other (which will be detailed descripted below).

(7) A first source-drain layer (SD1).

The first source-drain layer is made of a conductive material, for example, a metal material.

The first source-drain layer includes: the first power signal terminal VDD, the data signal terminal DATA, and the first light emitting access structure 331.

The first power signal terminal VDD is connected to the second electrode of the storage capacitor Cst through a via in the second interlayer insulating layer, and is connected to the first electrode of the sixth transistor T6 through vias in the gate insulating layer, the first interlayer insulating layer, and the second interlayer insulating layer; the data signal terminal DATA is connected to the second electrode of the fifth transistor T5 through vias in the gate insulating layer, the first interlayer insulating layer, and the second interlayer insulating layer; and the first light emitting access structure 331 is connected to the second electrode of the seventh transistor T7 through vias in the gate insulating layer, the first interlayer insulating layer, and the second interlayer insulating layer.

Referring to FIG. 15, the first power signal terminal VDD and the data signal terminal DATA may be disposed in the first source-drain layer, and the first power signal terminal VDD is connected to the second electrode of the storage capacitor Cst, and the data signal terminal DATA is connected to the second electrode of the fifth transistor T5, to form the above pixel circuit.

However, the second electrode of the seventh transistor T7 needs to be connected to the first electrode of the light emitting device 2, but there are many layers between the second electrode of the seventh transistor T7 and the first electrode of the light emitting device 2 with a relatively large distance therebetween, so referring to FIG. 15, the first source-drain layer may further include the first light emitting access structure 331 connected to the second electrode of the seventh transistor T7, so as to implement that the second electrode of the seventh transistor T7 needs to be connected to the first electrode of the light emitting device 2 (which will be detailed descripted below), so as to avoid the occurrence of wire break.

If the above shielding structure 34 is provided, the first power signal terminal VDD is also connected to the shielding structure 34 through a via in the second interlayer insulating layer.

In some embodiments, the first source-drain layer further includes:

the first connection structure 351 connected to the second electrode of the eighth transistor T8 through vias in the gate insulating layer, the first interlayer insulating layer and the second interlayer insulating layer, and connected to the initialization signal terminal INIT through a via in the second interlayer insulating layer;

the second connection structure 352 connected to the second electrode of the third transistor T3 through vias in the gate insulating layer, the first interlayer insulating layer, and the second interlayer insulating layer, and connected to the initialization signal terminal INIT through a via in the second interlayer insulating layer;

the third connection structure 353 connected to the gate of the driving transistor TD through vias in the first interlayer insulating layer, the second interlayer insulating layer, and connected to the first electrode of the first transistor T1 through vias in the gate insulating layer, the first interlayer insulating layer, the second interlayer insulating layer.

Referring to FIGS. 10 and 15, in order to realize the electrical connection between the structures of some different layers in the pixel circuit, a plurality of corresponding connection structures may be further disposed in the first source-drain layer.

The connection structure may specifically include the first connection structure 351 for connecting the second electrode of the eighth transistor T8 to the initialization signal terminal INIT (for example, the first initialization signal terminal INIT1); the second connection structure 352 for connecting the second electrode of the third transistor T3 to the initialization signal terminal INIT (e.g., the second initialization signal terminal INIT2); and the third connection structure 353 for connecting the driving transistor TD (i.e., the first electrode of the storage capacitor Cst) to the first electrode of the first transistor T1 (e.g., through the notch in the above storage capacitor Cst), and so on.

Alternatively, it is also possible that the above connection structures are provided in other layers, or the forms of respective electrodes of the respective transistors and capacitors are changed so that a different connection structures are needed (8) A first planarization layer (PLN1).

The first planarization layer is made of an organic insulating material for eliminating a segment gap of an underlying structure.

Referring to FIG. 20, the first planarization layer may include: a via through which the first light emitting access structure 331 and the second light emitting access structure 332 are connected to each other, and a via through which the first power signal terminal VDD and the auxiliary conductive structure 31 are connected to each other (which will be detailed descripted below).

(9) A passivation layer (PVX).

The passivation layer is made of an insulating material, such as silicon nitride, silicon oxide, silicon oxynitride, etc., and is used to prevent a subsequently formed structure from directly contacting the first planarization layer.

The passivation layer and the first planarization layer are two continuous insulating layers (or are regarded as two sub-layers of one insulating layer). Thus, referring to FIG. 20, the via in the passivation layer is identical to the via in the first planarization layer.

Accordingly, throughout the description of the embodiments of the present disclosure, the via in the first planarization layer may also include a via in the passivation layer, which will not be described in detail herein.

(10) A second source-drain layer (SD2).

The second source-drain layer is made of a conductive material, for example, a metal material.

The second source-drain layer includes: the auxiliary conductive structure 31, the second light emitting access structure 332.

The auxiliary conductive structure 31 is overlapped with the first power signal terminal VDD, and is connected to the first power signal terminal VDD through a via in the first planarization layer; and the second light emitting access structure 332 is connected to the first light emitting access structure 331 through a via in the first planarization layer.

The auxiliary conductive structure 31 for reducing the power supply resistance of the first power signal Vdd may be located in the second source-drain layer and connected to the first power signal terminal VDD.

The second source-drain layer may further include the second light emitting access structure 332 connected to the first light emitting access structure 331, so that the first electrode of the subsequent light emitting device 2 is connected to the second electrode of the seventh transistor T7 through the second light emitting access structure 332 and the first light emitting access structure 331.

(11) A second planarization layer (PLN2).

The second planarization layer is made of an organic insulating material for eliminating a segment gap of an underlying structure.

Referring to FIG. 21, the second planarization layer may include: a via through which the second light emitting access structure 332 and the first electrode of the light emitting device 2 are connected to each other (which will be detailed descripted below).

(12) A first electrode of the light emitting device 2.

The first electrode of the light emitting device 2 is connected to the second light emitting access structure 332 through a via in the second planarization layer.

The first electrode of the light emitting device 2 may be disposed on the second planarization layer and connected to the second electrode of the seventh transistor T7 through the above second light emitting access structure 332 and the first light emitting access structure 331.

Specifically, the first electrode of the light emitting device 2 may be an anode of the organic light emitting diode OLED, which may be made of a metal oxide conductive material such as Indium Tin Oxide (ITO).

In some embodiments, in a direction gradually distal to the base plate, the display substrate further sequentially includes:

(13) A pixel definition layer (PDL).

The pixel definition layer is made of an organic insulating material for defining a range of the light emitting device 2, such as an organic light emitting diode OLED, through an opening in the pixel definition layer.

(14) A light emitting layer of the light emitting device 2.

The light emitting layer is actually used for emitting light in the light emitting device 2.

Specifically, the light emitting layer of the light emitting device 2 may be a light emitting layer of an organic light emitting diode OLED. The light emitting layer of the organic light emitting diode OLED is made of an organic material, and includes at least an organic light emitting layer (EML), and may further include other stacked auxiliary layers such as an Electron Injection Layer (EM), an Electron Transport Layer (ETL), a Hole Injection Layer (HIL), and a Hole Transport Layer (HTL).

The light emitting layer of the organic light emitting diode OLED may be a whole layer structure, and is in contact with the anode of the organic light emitting diode OLED at the opening of the pixel definition layer, thereby forming the organic light emitting diode OLED.

(15) A second electrode of the light emitting device 2.

Specifically, the second electrode of the light emitting device 2 may be a cathode of the organic light emitting diode OLED, and the cathode of the organic light emitting diode OLED may be made of a metal conductive material such as aluminum.

The cathode of the organic light emitting diode OLED may be a whole layer structure, and thus, is also the second power signal terminal VSS.

(16) An encapsulation layer.

The encapsulation layer may be a structure formed by organic layers and inorganic layers which are stacked and alternately disposed on each other, which are alternated, and is used for encapsulating other structures therein and preventing the other structures (especially the light emitting layer) from being aged due to contact with water and oxygen in the environment.

The complete film layer in each layer may be formed by a solution process, a deposition process and the like; if the above structures have specific shapes, the structures may be formed by a patterning process.

Alternatively, the particular layers described above are merely exemplary, and many variations thereof are possible.

For example, the layers in which respective structures are located may be different from each other; for example, the gate of each transistor may be located in a layer closer to the base plate than the active region thereof. That is, the transistors may be a "top gate transistor", instead of the above "bottom gate transistor".

In a fourth aspect, an embodiment of the present disclosure provides a display device, including:

a display substrate according to any one of the foregoing embodiments of the present disclosure.

The above display substrate may be combined with other devices (e.g., an aligning and assembling cover plate, a flexible wiring board, a driver chip, a power supply module, etc.) to form the display device having a display function.

In some embodiments, the display device is an Organic Light Emitting Diode (OLED) display device.

The above display substrate is used, such that the display device of the embodiment of the present disclosure has stable brightness, no flicker phenomenon and good display quality during display.

The present disclosure has disclosed example embodiments, and although specific terms are employed, they are used and should be interpreted in a generic and descriptive sense only and not for purposes of limitation. In some instances, features, characteristics and/or elements described in connection with a particular embodiment may be used alone or in combination with features, characteristics and/or elements described in connection with other embodiments, unless expressly stated otherwise, as would be apparent to one skilled in the art. Therefore, it will be understood by one skilled in the art that various changes in form and details may be made without departing from the scope of the present disclosure as set forth in the appended claims.

What is claimed is:

1. A pixel circuit, comprising:
   a light emitting module configured to emit light;
   a driving module configured to drive the light emitting module to emit light according to a driving voltage during a light emitting stage;
   a storage module configured to maintain the driving voltage and to provide the driving voltage to the driving module during the light emitting stage;
   a first transistor, a first electrode of the first transistor being connected to a position where the driving module receives the driving voltage, and a second electrode of the first transistor being not directly connected to a signal source;
   a second transistor, a first electrode of the second transistor being connected to the first electrode of the first transistor, wherein a structure to which a second electrode of the second transistor is connected is different from a structure to which the second electrode of the first transistor is connected; wherein during the light emitting stage, a voltage at the second electrode of the first transistor is lower than that at the first electrode of the first transistor and a voltage at the second electrode of the second transistor is higher than that at the first electrode of the first transistor; and
   a voltage stabilizing capacitor, a first electrode of the voltage stabilizing capacitor being connected to the second electrode of the first transistor, and a second electrode of the voltage stabilizing capacitor being connected to a constant voltage signal source.

2. The pixel circuit of claim 1, further comprising:
   a third transistor, a first electrode of the third transistor being connected to the second electrode of the first transistor, and a gate of the third transistor being connected to a gate of the first transistor;
   a fourth transistor, a first electrode of the fourth transistor being connected to the second electrode of the second transistor, and a gate of the fourth transistor being connected to a gate of the second transistor;
   wherein the light emitting module comprises a light emitting device;
   the driving module comprises a driving transistor configured to drive the light emitting device to emit light according to a voltage at a gate of the driving transistor; and
   the storage module comprises a storage capacitor, which has a first electrode connected to the gate of the driving transistor and is configured to maintain the driving voltage at the first electrode thereof and provide the driving voltage to the driving module during the light emitting stage.

3. The pixel circuit of claim 2, wherein the pixel circuit comprises a first reset module and a write module;
   the first reset module is configured to reset the voltage at the gate of the driving transistor according to signals at an initialization signal terminal and a first reset signal terminal; the first reset module comprises:
   the first transistor;
   the third transistor, the first electrode of the third transistor being connected to the second electrode of the first transistor, a second electrode of the third transistor being connected to the initialization signal terminal and the gate of the third transistor being connected to the gate of the first transistor and the first reset signal terminal;

the write module is configured to write the driving voltage to the first electrode of the storage capacitor according to signals at a gate signal terminal and a data signal terminal; the write module comprises:

the second transistor;

the fourth transistor, the first electrode of the fourth transistor being connected to the second electrode of the second transistor, a second electrode of the fourth transistor being connected to the second electrode of the driving transistor and the gate of the fourth transistor being connected to the gate of the second transistor and the gate signal terminal;

a fifth transistor, a first electrode of the fifth transistor being connected to the first electrode of the driving transistor, a second electrode of the fifth transistor being connected to the data signal terminal, and a gate of the fifth transistor being connected to the gate signal terminal;

a sixth transistor, a first electrode of the sixth transistor being connected to a first power signal terminal, a second electrode of the sixth transistor being connected to the first electrode of the driving transistor, and a gate of the sixth transistor being connected to a control signal terminal;

wherein, the driving transistor and the light emitting device are connected in series between the first power signal terminal and a second power signal terminal;

a second electrode of the storage capacitor is connected to the first power signal terminal; and a second electrode of the light emitting device is connected to the second power signal terminal.

4. The pixel circuit of claim 3, wherein
the constant voltage signal source is any one of the initialization signal terminal, the first power signal terminal, and the second power signal terminal.

5. The pixel circuit of claim 3, further comprising:
a control module configured to control the light emitting device to emit light according to a signal at the control signal terminal; the control module comprises: a seventh transistor, a first electrode of the seventh transistor being connected to the second electrode of the driving transistor, a second electrode of the seventh transistor being connected to a first electrode of the light emitting device, and a gate of the seventh transistor being connected to the control signal terminal;

a second reset module configured to reset the voltage at the first electrode of the light emitting device according to signals at a second reset signal terminal and the initialization signal terminal; the second reset module comprises: an eighth transistor, a first electrode of the eighth transistor being connected to the first electrode of the light emitting device, a second electrode of the eighth transistor being connected to the initialization signal terminal, and a gate of the eighth transistor being connected to the second reset signal terminal.

6. The pixel circuit of claim 5, wherein
the driving transistor, the first transistor, the second transistor, the third transistor, the fourth transistor, the fifth transistor, the sixth transistor, the seventh transistor, and the eighth transistor are all P-type transistors; or, the driving transistor, the first transistor, the second transistor, the third transistor, the fourth transistor, the fifth transistor, the sixth transistor, the seventh transistor, and the eighth transistor are all N-type transistors.

7. A driving method for a pixel circuit, wherein the pixel circuit is the pixel circuit of claim 3, the driving method for the pixel circuit comprises steps of:
causing the storage module to maintain the driving voltage and to provide the driving voltage to the driving module during the light emitting stage.

8. The driving method for a pixel circuit of claim 7, wherein the driving method for the pixel circuit comprises steps of:
continuously providing an initialization signal to the initialization signal terminal, continuously providing a first power signal to the first power signal terminal, and continuously providing a second power signal to the second power signal terminal;

during a reset stage, providing a turn-on signal to the first reset signal terminal, providing a turn-off signal to the gate signal terminal, and providing a turn-off signal to the control signal terminal;

during a write stage, providing a turn-off signal to the first reset signal terminal, providing a turn-on signal to the gate signal terminal, providing a turn-off signal to the control signal terminal, and providing a data signal to the data signal terminal; and during a light emitting stage, providing a turn-off signal to the first reset signal terminal, providing a turn-off signal to the gate signal terminal, and providing a turn-on signal to the control signal terminal.

9. The driving method for a pixel circuit of claim 8, wherein the pixel circuit further comprises:
a control module configured to control the light emitting device to emit light according to a signal at the control signal terminal; the control module comprises: a seventh transistor, a first electrode of the seventh transistor being connected to the second electrode of the driving transistor, a second electrode of the seventh transistor being connected to a first electrode of the light emitting device, and a gate of the seventh transistor being connected to the control signal terminal;

a second rest module configured to reset the voltage at the first electrode of the light emitting device according to signals at a second reset signal terminal and the initialization signal terminal; the second reset module comprises: an eighth transistor, a first electrode of the eighth transistor being connected to the first electrode of the light emitting device, a second electrode of the eighth transistor being connected to the initialization signal terminal, and a gate of the eighth transistor being connected to the second reset signal terminal, and the driving method for the pixel circuit comprises steps of:

during the reset stage, providing a turn-off signal to the second reset signal terminal;

during the write stage, providing a turn-on signal to the second reset signal terminal;

during the light emitting stage, providing a turn-off signal to the second reset signal terminal.

10. A display substrate, comprising:
a base plate;
a plurality of sub-pixels on the base plate, at least a part of which comprise the pixel circuit of claim 3.

11. The display substrate of claim 10, wherein
the first electrode of the voltage stabilizing capacitor comprises: a connection portion connected between the first electrode of the third transistor and the second electrode of the first transistor; and an additional portion connected to the connection portion.

12. The display substrate of claim 10, wherein the first electrode of the voltage stabilizing capacitor and the second electrode of the first transistor are in a same layer and connected as a single piece.

13. The display substrate of claim 12, wherein the first electrode of the voltage stabilizing capacitor is in a same layer as an active region of the driving transistor, and is made of a conductorized semiconductor material; and
the second electrode of the first transistor is in a same layer as the active region of the driving transistor, and is made of a conductorized semiconductor material.

14. The display substrate of claim 13, wherein the second electrode of the voltage stabilizing capacitor and the initialization signal terminal are in a same layer and are connected as a single piece.

15. The display substrate of claim 14, wherein in a direction gradually away from the base plate, the display substrate sequentially comprises:
the active region of the driving transistor and the first electrode of the voltage stabilizing capacitor;
a gate insulating layer;
the gate of the driving transistor;
a first interlayer insulating layer; and
the second electrode of the voltage stabilizing capacitor and the initialization signal terminal.

16. The display substrate of claim 10, wherein the pixel circuit further comprises:
a control module configured to control the light emitting device to emit light according to a signal at the control signal terminal; the control module comprises: a seventh transistor, a first electrode of the seventh transistor being connected to the second electrode of the driving transistor, a second electrode of the seventh transistor being connected to a first electrode of the light emitting device, and a gate of the seventh transistor being connected to the control signal terminal;
a second rest module configured to reset the voltage at the first electrode of the light emitting device according to signals at a second reset signal terminal and the initialization signal terminal; the second reset module comprises: an eighth transistor, a first electrode of the eighth transistor being connected to the first electrode of the light emitting device, a second electrode of the eighth transistor being connected to the initialization signal terminal, and a gate of the eighth transistor being connected to the second reset signal terminal;
the initialization signal terminal comprises a first initialization signal terminal and a second initialization signal terminal in a same layer, and the first initialization signal terminal and the second initialization signal terminal are parallel to and separated from each other;
the second electrode of the eighth transistor is connected to the first initialization signal terminal; and
the second electrode of the third transistor is connected to the second initialization signal terminal.

17. The display substrate of claim 10, wherein the first electrode of the voltage stabilizing capacitor extends along a first direction; and
the data signal terminal and/or the first power signal terminal extend along a second direction; the first direction intersects the second direction.

18. The display substrate of claim 10, wherein, the pixel circuit further comprises:
a control module configured to control the light emitting device to emit light according to a signal at the control signal terminal; the control module comprises: a seventh transistor, a first electrode of the seventh transistor being connected to the second electrode of the driving transistor, a second electrode of the seventh transistor being connected to a first electrode of the light emitting device, and a gate of the seventh transistor being connected to the control signal terminal;
a second rest module configured to reset the voltage at the first electrode of the light emitting device according to signals at a second reset signal terminal and the initialization signal terminal; the second reset module comprises: an eighth transistor, a first electrode of the eighth transistor being connected to the first electrode of the light emitting device, a second electrode of the eighth transistor being connected to the initialization signal terminal, and a gate of the eighth transistor being connected to the second reset signal terminal;
the first reset signal terminal extends along a first direction;
the first reset signal terminal of the pixel circuit is multiplexed as the second reset signal terminal of an adjacent pixel circuit along the second direction; the first direction intersects the second direction.

19. The display substrate of claim 10, wherein the second electrode of the storage capacitor comprises a lateral connection structure extending along a first direction; the lateral connection structures of at least some of the pixel circuits adjacent to each other in the first direction are connected to each other; and
the first power signal terminal extends along a second direction; the first direction intersects the second direction.

20. The display substrate of claim 10, wherein the display substrate further comprises:
an auxiliary conductive structure overlapped with the first power signal terminal; wherein at least one insulating layer is between the auxiliary conductive structure and the first power signal terminal, and the auxiliary conductive structure is connected to the first power signal terminal through a via in the insulating layer.

21. The display substrate of claim 10, wherein the pixel circuit further comprises:
a control module configured to control the light emitting device to emit light according to a signal at the control signal terminal; the control module comprises: a seventh transistor, a first electrode of the seventh transistor being connected to the second electrode of the driving transistor, a second electrode of the seventh transistor being connected to a first electrode of the light emitting device, and a gate of the seventh transistor being connected to the control signal terminal;
a second rest module configured to reset the voltage at the first electrode of the light emitting device according to signals at a second reset signal terminal and the initialization signal terminal; the second reset module comprises: an eighth transistor, a first electrode of the eighth transistor being connected to the first electrode of the light emitting device, a second electrode of the eighth transistor being connected to the initialization signal terminal, and a gate of the eighth transistor being connected to the second reset signal terminal; in a direction gradually away from the base plate, the display substrate sequentially comprises:

a semiconductor layer, comprising: the first electrode, the second electrode, and an active region of the driving transistor; the first electrode, the second electrode, and an active region of the first transistor; the first electrode, the second electrode, and an active region of the second transistor; the first electrode, the second electrode, and an active region of the third transistor; the first electrode, the second electrode, and an active region of the fourth transistor; the first electrode, the second electrode, and an active region of the fifth transistor; the first electrode, the second electrode, and an active region of the sixth transistor; the first electrode, the second electrode, and an active region of the seventh transistor; the first electrode, the second electrode, and an active region of the eighth transistor; and the first electrode of the voltage stabilizing capacitor, wherein the first electrode of the voltage stabilizing capacitor and the second electrode of the first transistor are connected as a single piece, and are made of a conductorized semiconductor material;

a gate insulating layer;

a first gate layer comprising: the gate of the driving transistor, the gate of the first transistor, the gate of the second transistor, the gate of the third transistor, the gate of the fourth transistor, the gate of the fifth transistor, the gate of the sixth transistor, the gate of the seventh transistor, the gate of the eighth transistor, the first reset signal terminal, the second reset signal terminal, the control signal terminal, and the first electrode of the storage capacitor;

a first interlayer insulating layer;

a second gate layer comprising: the initialization signal terminal, the second electrode of the voltage stabilizing capacitor and the second electrode of the storage capacitor; wherein the second electrode of the voltage stabilizing capacitor and the initialization signal terminal are connected as a single piece;

a second interlayer insulating layer;

a first source-drain layer comprising: the first power signal terminal, the data signal terminal and a first light emitting access structure; wherein the first power signal terminal is connected to the second electrode of the storage capacitor through a via in the second interlayer insulating layer, and is connected to the first electrode of the sixth transistor through a via in the gate insulating layer, the first interlayer insulating layer and the second interlayer insulating layer; the data signal terminal is connected to the second electrode of the fifth transistor through vias in the gate insulating layer, the first interlayer insulating layer and the second interlayer insulating layer, and the first light emitting access structure is connected to the second electrode of the seventh transistor through vias in the gate insulating layer, the first interlayer insulating layer and the second interlayer insulating layer;

a first planarization layer;

a second source-drain layer comprising: an auxiliary conductive structure and a second light emitting access structure; wherein the auxiliary conductive structure is overlapped with the first power signal terminal and is connected to the first power signal terminal through a via in the first planarization layer; the second light emitting access structure is connected to the first light emitting access structure through a via in the first planarization layer;

a second planarization layer; and the first electrode of the light emitting device connected to the second light emitting access structure through a via in the second planarization layer.

22. The display substrate of claim 21, wherein the second gate layer further comprises:

a shielding structure connected to the first power signal terminal through a via in the second interlayer insulating layer, wherein the shielding structure is overlapped with and insulated from the first electrode of the first transistor and the second electrode of the fifth transistor.

23. The display substrate of claim 21, wherein the first source-drain layer further comprises:

a first connection structure connected to the second electrode of the eighth transistor through a via in the gate insulating layer, the first interlayer insulating layer and the second interlayer insulating layer, and connected to the initialization signal terminal through a via in the second interlayer insulating layer;

a second connection structure connected to the second electrode of the third transistor through a via in the gate insulating layer, the first interlayer insulating layer and the second interlayer insulating layer, and connected to the initialization signal terminal through a via in the second interlayer insulating layer; and a third connection structure connected to the gate of the driving transistor through a via in the first interlayer insulating layer and the second interlayer insulating layer, and connected to the first electrode of the first transistor through a via in the gate insulating layer, the first interlayer insulating layer and the second interlayer insulating layer.

24. The display substrate of claim 10, wherein a capacitance of the voltage stabilizing capacitor is not lower than 8 fF and not more than one fourth of a capacitance of the storage capacitor.

25. A display device, comprising:

a display substrate of claim 10.

* * * * *